(12) United States Patent
Lee et al.

(10) Patent No.: US 11,367,771 B2
(45) Date of Patent: Jun. 21, 2022

(54) DISPLAY DEVICE AND METHOD OF MANUFACTURING THE SAME

(71) Applicant: Samsung Display Co., Ltd., Yongin-si (KR)

(72) Inventors: Seong Ryong Lee, Yongin-si (KR); Jae Kyoung Kim, Yongin-si (KR); Won Sang Park, Yongin-si (KR); Jong In Baek, Yongin-si (KR); Eun Jin Sung, Yongin-si (KR); Jong Hyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 16/989,672

(22) Filed: Aug. 10, 2020

(65) Prior Publication Data

US 2021/0050403 A1    Feb. 18, 2021

(30) Foreign Application Priority Data

Aug. 16, 2019   (KR) .................. 10-2019-0100546

(51) Int. Cl.
*H01L 27/32* (2006.01)
*H01L 51/56* (2006.01)
*H01L 51/52* (2006.01)

(52) U.S. Cl.
CPC ........ *H01L 27/3276* (2013.01); *H01L 27/326* (2013.01); *H01L 51/5284* (2013.01); *H01L 51/56* (2013.01); *H01L 2227/323* (2013.01)

(58) Field of Classification Search
CPC .......................... H01L 27/3276; H01L 27/326
See application file for complete search history.

(56) References Cited

U.S. PATENT DOCUMENTS

| 10,268,884 | B2 | 4/2019 | Jones et al. |
| 10,360,431 | B2 | 7/2019 | Gozzini et al. |
| 2019/0006440 | A1 | 1/2019 | Sun et al. |
| 2020/0134284 | A1* | 4/2020 | Ling ................. G06F 3/0421 |
| 2020/0203468 | A1* | 6/2020 | Zeng ................ H01L 27/3276 |
| 2020/0212135 | A1* | 7/2020 | Zhang .............. H01L 27/3276 |

(Continued)

FOREIGN PATENT DOCUMENTS

KR    10-2018-0100140 A    9/2018

*Primary Examiner* — Douglas M Menz
(74) *Attorney, Agent, or Firm* — Lewis Roca Rothgerber Christie LLP

(57) ABSTRACT

A display device of embodiments of the present disclosure may include a substrate including a display area including a plurality of pixel areas, and a non-display area adjacent the display area, a circuit element layer on the substrate, and including a plurality of non-transmission areas in which a plurality of signal lines for transferring signals for driving a pixel are positioned, and a plurality of transmission areas for transmitting light and located between the signal lines in a plan view, a light emitting element layer on the circuit element layer, and including light emitting elements, and a light blocking layer between the substrate and the circuit element layer, and including a plurality of first opening portions overlapping the non-transmission area, and a plurality of second opening portions overlapping the transmission area, wherein one of the non-transmission areas and the transmission area are in each of the pixel areas.

18 Claims, 10 Drawing Sheets

(56) References Cited

U.S. PATENT DOCUMENTS

2020/0293739 A1* 9/2020 Yang .................... H01L 27/3234
2020/0343312 A1* 10/2020 Ryu ..................... H01L 27/3234
2020/0373372 A1* 11/2020 Chung ................. H01L 27/3272
2020/0395433 A1* 12/2020 Sung ................... G06V 40/1318

* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2019-0100546 filed on Aug. 16, 2019 in the Korean Patent Office (KIPO), the entire content of which is incorporated herein by reference.

BACKGROUND

1. Field

Embodiments of the present disclosure relate to a display device, and a method of manufacturing the display device.

2. Discussion of the Related Art

In recent years, as a display device, such as a smartphone or a tablet PC has been widely used, a biometric information authentication method using a fingerprint or the like of a user has been widely used. To provide a fingerprint sensing function, a fingerprint sensor may be provided in a form in which the fingerprint sensor is embedded or attached to a display device.

For example, the fingerprint sensor may be configured of a sensor implemented using a light sensing method. The fingerprint sensor of the light sensing method may include a light source, a lens, and a light sensor array.

SUMMARY

Embodiments of the present disclosure provide a display device capable of repairing a pixel area (e.g., a damaged pixel area).

A display device according to embodiments of the present disclosure may include a substrate including a display area including a plurality of pixel areas, and a non-display area adjacent the display area, a circuit element layer on the substrate, and including a plurality of non-transmission areas in which a plurality of signal lines for transferring signals for driving a pixel are positioned, and a plurality of transmission areas for transmitting light and located between the signal lines in a plan view, a light emitting element layer on the circuit element layer, and including light emitting elements, and a light blocking layer between the substrate and the circuit element layer, and including a plurality of first opening portions overlapping the non-transmission area, and a plurality of second opening portions overlapping the transmission area, wherein one of the non-transmission areas and the transmission area are in each of the pixel areas.

At least one of the first opening portions may overlap one of the non-transmission areas in which one of the signal lines, which is electrically connected to a driving transistor of one of the pixel areas, is positioned.

At least one of the first opening portions may overlap one of the non-transmission areas in which one of the signal lines, which is electrically connected to a switching transistor of one of the pixel areas, is positioned.

At least one of the first opening portions may overlap one of the non-transmission areas in which one of the signal lines, which is electrically connected to a transistor connected between a driving transistor of one of the pixel areas and the light emitting element, is located.

Each of the first opening portions may overlap one of the non-transmission areas in which the signal lines, which are electrically connected to a plurality of transistors of one of the pixel areas, are positioned.

The circuit element layer may include a plurality of conductive layers including the non-transmission areas in which the signal lines are positioned, and a second non-transmission area may overlap a first non-transmission area of the non-transmission areas of the conductive layers in which the signal lines, which are electrically connected to the transistors, are positioned, and is on a corresponding one of the first opening portions.

The second non-transmission area may overlap at least one of the signal lines and circuit elements for driving the pixel.

The second non-transmission area may include a dummy pattern on the first non-transmission area that does not overlap the signal lines and circuit elements for driving the pixel.

A size of the second non-transmission area may be greater than a size of the corresponding one of the first opening portions.

The display device may further include a sensor layer on a surface of the substrate that is opposite to another surface of the substrate on which the light blocking layer is provided, the sensor layer being configured to sense incident light.

The second opening portions may provide a path of light incident to the sensor layer.

A method of manufacturing a display device according to embodiments of the present disclosure may include providing a substrate providing a substrate including a display area including a plurality of pixel areas, and a non-display area adjacent the display area, providing a circuit element layer on the substrate, the circuit element layer including a plurality of non-transmission areas in which a plurality of signal lines for transferring signals for driving one of the pixels are positioned, and a plurality of transmission areas for transmitting light and being located between the signal lines in a plan view, providing a light emitting element layer including light emitting elements on the circuit element layer, providing a light blocking layer between the substrate and the circuit element layer, the light blocking layer including a plurality of first opening portions overlapping the non-transmission area, and a plurality of second opening portions overlapping the transmission area, and performing a repair operation by emitting light to one or more of the first opening portions overlapping one of the pixel areas, and disconnecting one or more of the signal lines electrically connected to a transistor of one of the pixel areas, wherein the non-transmission area and the transmission area are located in each of the pixel areas.

Performing the repair operation may include emitting light from the substrate to the circuit element layer.

Performing the repair operation may include emitting light to one or more of the first opening portions overlapping the signal lines that are electrically connected to a plurality of transistors of one of the pixel areas.

Performing the repair operation may include emitting light to one or more of the first opening portions overlapping one or more of the signal lines that are electrically connected to a driving transistor of one of the pixel areas.

Performing the repair operation may include emitting light to one of the first opening portions overlapping one of the signal lines electrically connected to a switching transistor of one of the pixel areas.

Performing the repair operation may include emitting light to one of the first opening portions overlapping one of the signal lines electrically connected to a transistor connected between a driving transistor of one of the pixel areas and the light emitting element.

The method may further include providing a sensor layer, which is configured to sense incident light, on a surface of the substrate that is opposite to another surface of the substrate on which the light blocking layer is provided.

The display device according to embodiments of the present disclosure may enable repair by emitting light to a damaged pixel area through the plurality of first opening portions provided in the light blocking layer.

BRIEF DESCRIPTION OF THE DRAWINGS

The above and other aspects of the present disclosure will become more apparent by describing in further detail embodiments thereof with reference to the accompanying drawings, in which.

DETAILED DESCRIPTION

Figure 1:
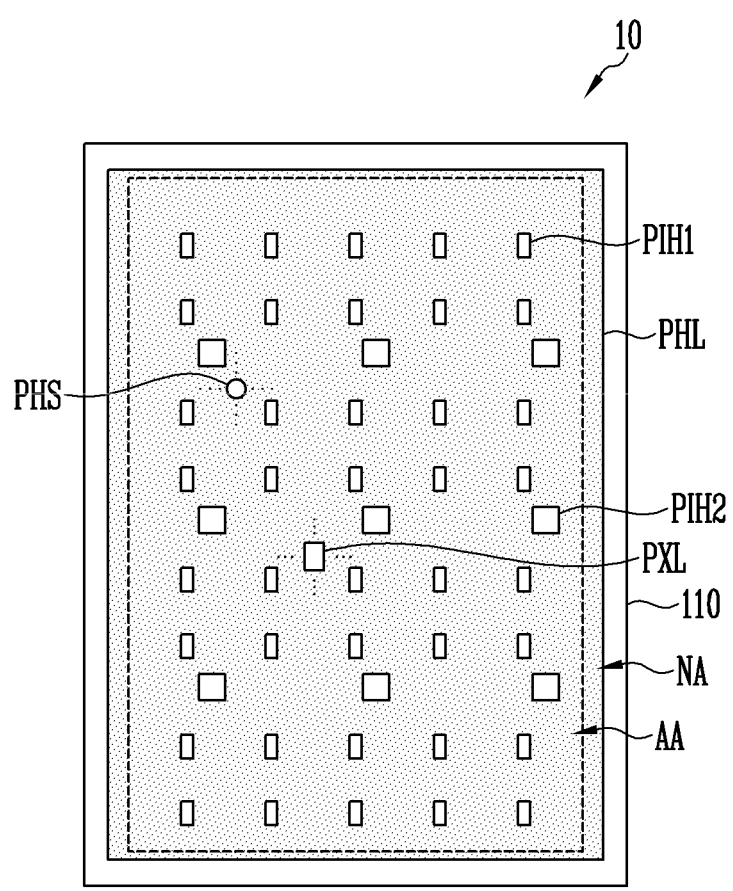
FIG. 1 is a plan view schematically illustrating a display device according to embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
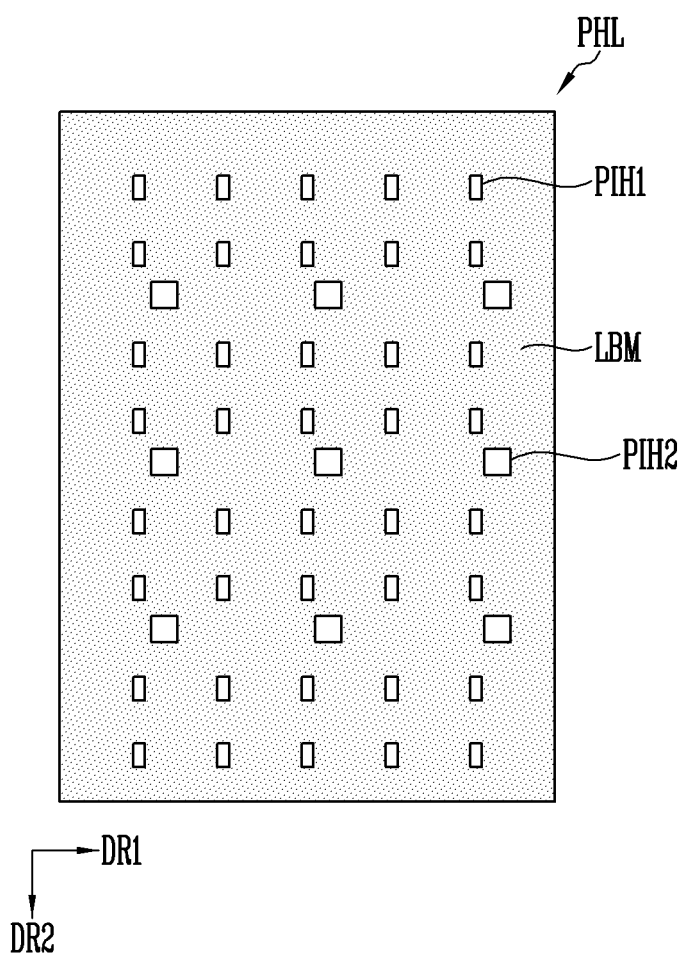
FIG. 2 is a plan view illustrating a light blocking layer according to embodiments of the present disclosure.
Figure 3:
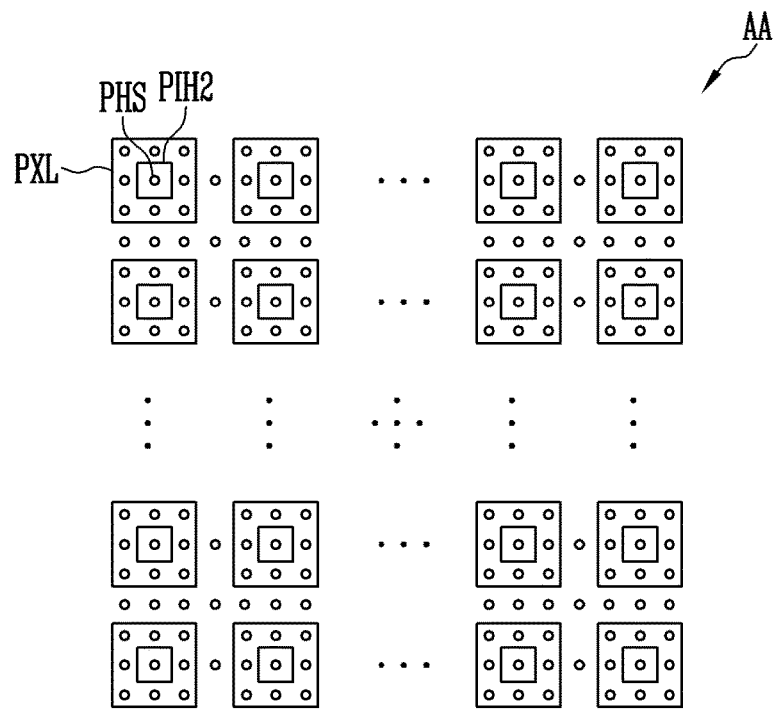
FIG. 3 is a plan view illustrating a disposition structure of pixels, second opening portions, and light sensors.
Figure 4:
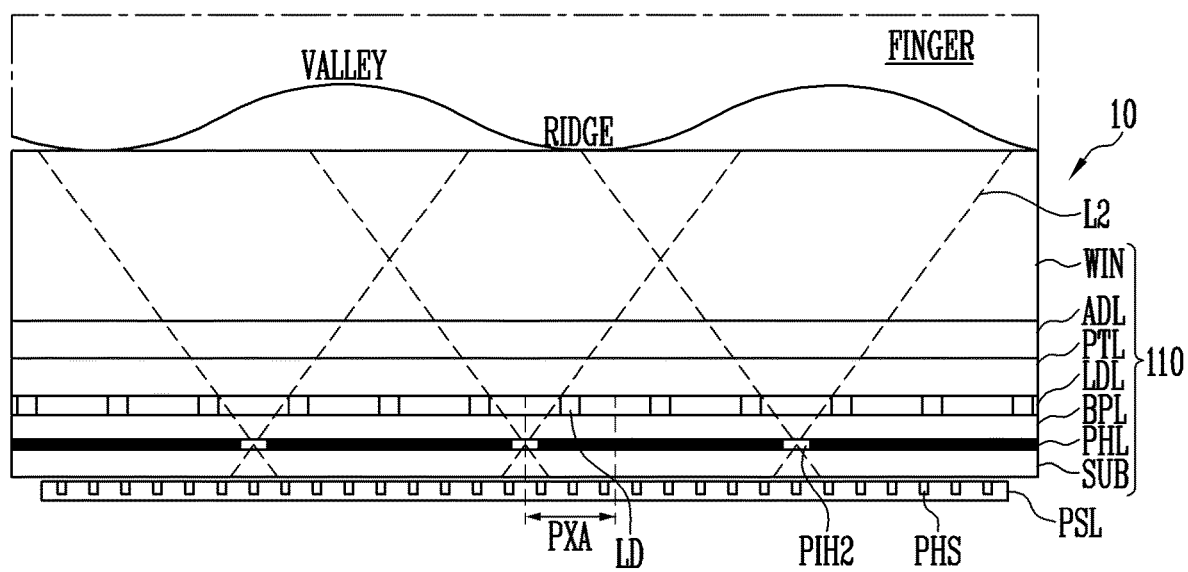
FIG. 4 is a cross-sectional view of the display device according to embodiments of the present disclosure.

FIG. 1 is a plan view schematically illustrating a display device according to embodiments of the present disclosure, FIG. 2 is a plan view illustrating a light blocking layer according to embodiments of the present disclosure, FIG. 3 is a plan view illustrating a disposition structure of pixels, second opening portions, and light sensors, and FIG. 4 is a cross-sectional view of the display device according to embodiments of the present disclosure.

Referring to FIGS. 1 to 4, the display device 10 according to embodiments of the present disclosure may include a substrate SUB, the light blocking layer PHL, a circuit element layer BPL, and a light emitting element layer LDL. In addition, the display device 10 may further include a sensor layer PSL.

The display device 10 may be provided in various shapes. For example, the display device 10 may be provided in a plate shape of a rectangle having two pairs of sides parallel to each other. The display device 10 may display arbitrary visual information, for example, a text, a video, a photograph, a two-dimensional or three-dimensional image, and the like, in an image display direction.

A part of the display device 10 may have flexibility. For example, the display device 10 may have flexibility in the entire area, or may have flexibility in an area corresponding to a flexibility area.

The display device 10 may include a display area AA and a non-display area NA. The display area AA is an area where a plurality of pixels PXL (or subpixels) are provided, and may be referred to as an active area. In various embodiments, each of the pixels PXL may include at least one light emitting element LD. The light emitting element LD may be an organic light emitting diode or an ultra-small inorganic light emitting diode having a size in a micro to nano scale range, but the present disclosure is not limited thereto. The display device 10 displays an image in the display area AA by driving the pixels PXL in correspondence with image data input from the outside.

The non-display area NA is an area located around the display area AA and may be referred to as a non-active area. In various embodiments, the non-display area NA may comprehensively mean the remaining areas except for the display area AA on the substrate SUB.

In various embodiments of the present disclosure, the display device 10 may include the sensor layer PSL provided on a surface that is opposite to a surface of the substrate SUB on which the light blocking layer PHL is provided, the sensor layer PSL being configured to sense incident light. The sensor layer PSL may include a plurality of light sensors PHS, and the light sensors PHS may overlap the display area AA.

In one or more embodiments, the light sensors PHS may sense that light emitted from a light source is reflected by a finger of the user, and may sense a fingerprint of the user by analyzing the reflected light. Hereinafter, embodiments of the present disclosure will be described with an example in which the light sensors PHS are used for fingerprint sensing. However, in various embodiments, the light sensors PHS may be used for performing various functions, such as touch sensing or scanning functions.

FIG. 2 illustrates the light blocking layer PHL of the type shown in FIG. 1.

In various embodiments of the present disclosure, the display device 10 may include the light blocking layer PHL. The light blocking layer PHL may be located in the display panel 110, or may be located between the display panel 110 and the sensor layer PSL.

Referring to FIG. 2, the light blocking layer PHL of the present invention may include a light blocking mask LBM, and may define a plurality of first opening portions PIH1 and a plurality of second opening portions PIH2 distributed in the light blocking mask LBM.

The light blocking mask LBM may be configured of a light blocking material and/or a light absorbing material. For example, the light blocking mask LBM may be configured of an opaque metal layer that is locally opened in an area where the opening portions PIH1 and PIH2 are located. However, a configuration material of the light blocking mask LBM is not limited to a metal, and the light blocking mask LBM may be configured of various materials that may block light transmission. For example, the light blocking mask LBM may be configured of a black matrix material.

The opening portions PIH1 and PIH2 may be pinholes dispersed in the light blocking mask LBM. That is, the opening portions PIH1 and PIH2 are empty spaces in which at least one area of the light blocking mask LBM is removed and opened, and may be through holes passing through the light blocking mask LBM. Alternatively, the opening portions PIH1 and PIH2 may be optical holes configured to be transparent or translucent so as to selectively transmit only some of the incident light.

In FIG. 2, the opening portions PIH1 and PIH2 are shown as a rectangle, the technical spirit of embodiments of the present disclosure are not limited thereto. That is, in various embodiments, the opening portions PIH1 and PIH2 may have various shapes such as a rectangle, a circle, an ellipse, and a polygon. However, embodiments of the present disclosure are not limited thereto, and a size, a shape, the number, a resolution, an arrangement structure, and/or the like of the opening portions PIH1 and PIH2 may be variously changed. In addition, the opening portions PIH1 and PIH2 may be dispersed in a uniform or irregular pattern in the light blocking mask LBM.

As described later in FIGS. 7 and 10, the first opening portion PIH1 may provide a path through which light L1, which is emitted to the pixel area PXA that is damaged or that may benefit from repair, passes. For example, the light L1 for the repair may be laser light L1, but a type of the light is not limited thereto. The light used for repair of the pixel may be used without limitation in the art.

The second opening portion PIH2 may provide a progression path of light L2 that is incident to the sensor layer PSL. The light blocking layer PHL including the second opening portion PIH2 may selectively block or pass light L2 (hereinafter, referred to as reflected light) that is reflected from an object that is in contact with an upper end of the display panel 110, for example, a finger. Some of the reflected light L2 incident to the light blocking layer PHL may be blocked, and a remainder of the reflected light L2 may pass through the second opening portions PIH2 to reach the light sensors PHS under the light blocking layer PHL.

The second opening portions PIH2 may be formed at an appropriate size and distance to enable sensing of a shape of the fingerprint more clearly while preventing diffraction of the incident light L2. For example, a width of the second opening portions PIH2 may be set to about 10 times or more with respect to a wavelength of the incident light L2 to reduce or prevent diffraction of the light L2. In addition, the distance between the second opening portions PIH2 may be determined based on a distance between the light blocking layer PHL and the light sensors PHS, the wavelength of the incident light L2, and an observation view (a field of view (FOV)) for the second opening portions PIH2.

The light blocking layer PHL may configure an optical system for selectively transmitting only some of the reflected light L2 while blocking the remaining light. The light blocking layer PHL may configure a fingerprint sensor together with the light sensors PHS described above. In addition, the light blocking layer PHL may be integrally configured with the circuit element layer BPL of the display panel 110. In this case, a thickness of a module of the display device 10 including the fingerprint sensor of a light sensing method may be reduced or minimized.

FIG. 3 illustrates a relative size, a resolution, and/or a disposition relationship of the pixels PXL, the second opening portions PIH2, and light sensors PHS located in the display area AA of FIG. 1.

In various embodiments of the present disclosure, the light sensors PHS may be located in the display area AA. For example, the light sensors PHS may overlap at least some of, or an entirety of, the pixels PXL provided in the display area AA, or may be located around the pixels PXL. For example, at least some or all of the light sensors PHS may be provided between the pixels PXL.

In one or more embodiments in which the light sensors PHS are located adjacent to the pixels PXL, the light sensors PHS may use the light emitting element LD provided in at least one pixel PXL located in the display area AA as a light source. In such an embodiment, the light sensors PHS may configure a fingerprint sensor for sensing light together with the pixels PXL of the display area AA, such as the light emitting elements LD provided in the pixels PXL. As described above, when the display device 10 with the fingerprint sensor is configured by using the pixels PXL as a light source without a separate external light source, a module thickness of the display device 10 having the fingerprint sensor for sensing light may be reduced, and a manufacturing cost may be reduced.

In some embodiments, the light sensors PHS may be greater in number than the second opening portions PIH2 and the pixels. At least some of the light sensors PHS may overlap any one of the second opening portions PIH2 and/or the pixels PXL, but the present disclosure is not limited thereto. For example, some of the light sensors PHS may be located to overlap the second opening portions PIH2 and/or the pixels PXL, and other sensors PHS or portions thereof may be located in a gap between the pixels PXL.

Referring to FIG. 3, the light sensors PHS are densely located in the display area AA such that 1:1 alignment is not required between the pixels PXL and/or the second opening portions PIH2, and thus moiré generation may be reduced, prevented, or minimized regardless of whether the pixels PXL and/or the second opening portions PIH2 and the light sensor PHS are aligned.

The disposition structure of the pixels PXL, the second opening portions PIH2, and the light sensors PHS is not limited to FIG. 3. For example, a shape, an arrangement shape, a relative size, the number, a resolution, a mutual disposition relationship, and/or the like of the pixels PXL, the second opening portions PIH2, and/or the light sensors PHS located in the display area AA may be variously changed.

In addition, FIG. 3 illustrates the second opening portions PIH2 and the light sensor PHS arranged in a regular array shape in the display area AA, but the present disclosure is not limited thereto. That is, the second opening portions PIH2 and/or the light sensors PHS may be irregularly scattered in the display area AA, or may be distributed in different densities or arrangement structures according to respective areas or sections of the display area AA.

FIG. 4 is a cross-sectional view of a display device according to embodiments of the present disclosure.

Figure 7:
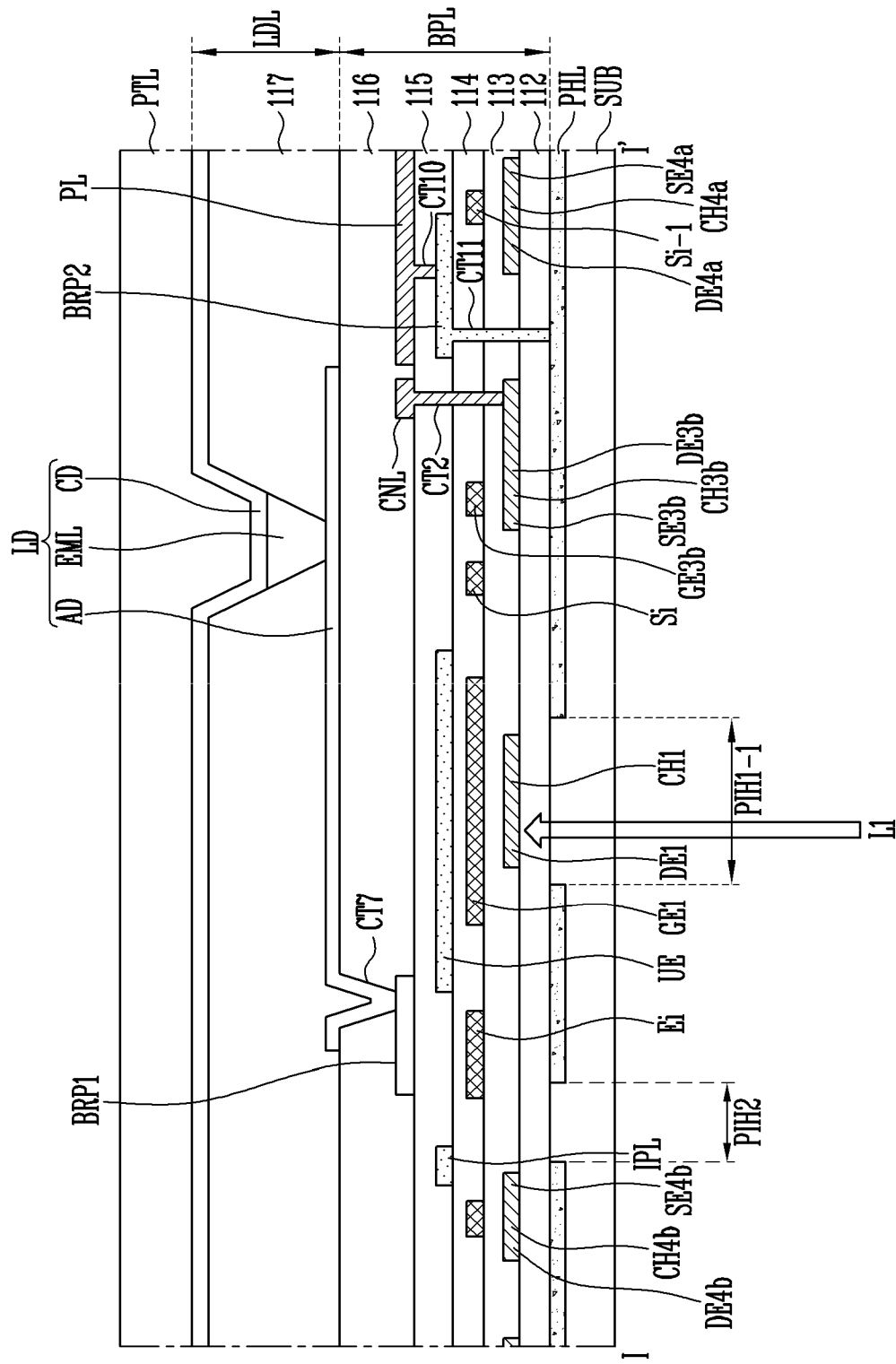
FIG. 7 is a cross-sectional view taken along the line I-I' of FIG. 6.
Figure 10:
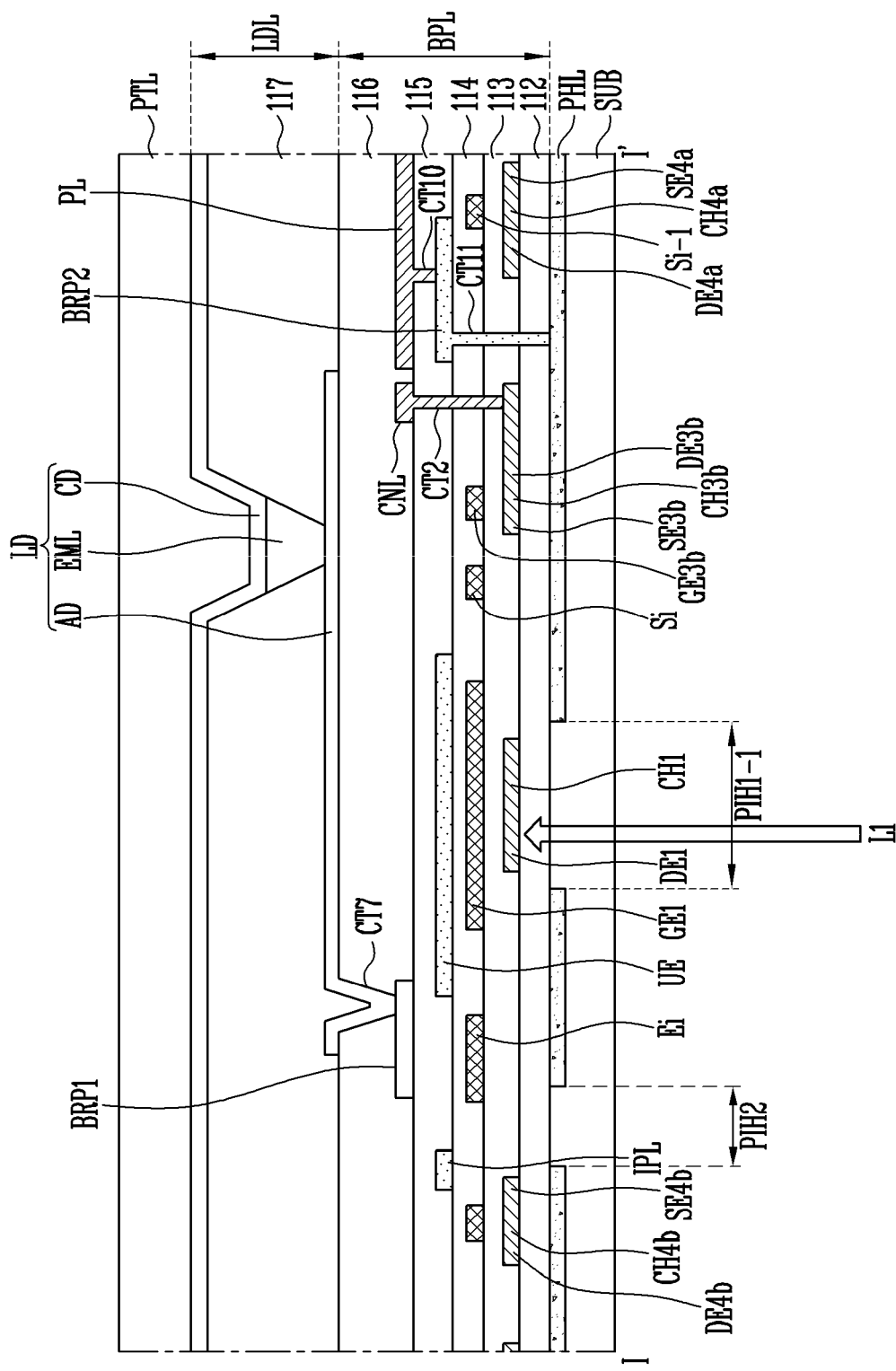
FIG. 10 illustrates a repair performed in a cross-sectional view along the line I-I' of FIG. 6

Referring to FIGS. 4, 7 and 10, the display device 10 according to embodiments of the present disclosure may include a display panel 110, and a sensor layer PSL located on one surface of the display panel 110.

The display panel 110 may display an image. The display panel 110 displays an image, and a type of the display panel 110 is not for example limited. The display panel 110 may be a display panel capable of self-emission, such as an organic light emitting display panel (OLED panel). In addition, the display panel 110 may be a non-light emitting display panel, such as a liquid crystal display panel (LCD panel), an electro-phoretic display panel (EPD panel), and an electro-wetting display panel (EWD panel). When the display panel 110 is configured as a non-light emitting display panel, the display device 10 may include a backlight unit that supplies light to the display panel 110.

The display panel 110 may include a substrate SUB, and also includes a light blocking layer PHL, a circuit element layer BPL, a light emitting element layer LDL, a protective layer PTL, an adhesive layer ADL, and a window WIN, which are sequentially located on one surface (for example, an upper surface) of the substrate SUB. In other embodiments, the display device 10 may also include an additional adhesive layer (e.g., a second adhesive layer) and an additional protective layer (e.g., a second protective layer), which are sequentially located on another surface (for example, a lower surface) of the substrate SUB.

The substrate SUB may be a substantially transparent transmission substrate as a base substrate of the display panel 110. The substrate SUB may be a rigid substrate including glass or tempered glass, or may be a flexible substrate of a plastic material. However, the material of the substrate SUB is not limited thereto, and the substrate SUB may be configured of various materials in other embodiments.

The substrate SUB may include the display area AA and the non-display area NA as shown in FIGS. 1 and 2. In addition, the display area AA may include a plurality of pixel areas PXA in which the pixels PXL are respectively located and/or formed.

The circuit element layer BPL may be located on the light blocking layer PHL, and may include a plurality of circuit elements for configuring a pixel circuit of the pixels PXL, and may also include signal lines for supplying various power and signals for driving the pixels PXL.

In this case, the circuit element layer BPL may include a non-transmission area in which circuit elements and/or signal lines are positioned, and thus light is not transmitted. In addition, the circuit element layer BPL may include one or more transmission areas in which the circuit elements and the signal lines are not positioned, and thus light is transmitted therethrough. That is, the transmission area is an area between the circuit elements, between the circuit elements and the signal lines, and between the signal lines on a plane/in a plan view, and may mean an area in which the circuit elements and the signal lines are not provided so that light may be transmitted.

In various embodiments of the present disclosure, the circuit element layer BPL may include conductive layers of multiple layers including the non-transmission areas in which the signal lines are positioned. For example, the circuit element layer BPL may be formed in a multilayer structure in which layers provided with the circuit elements and the signal lines are stacked.

For example, the non-transmission area may mean an area in which the circuit elements and/or the signal lines are positioned in at least one layer of each layer configuring the multilayer structure, and thus light does not pass through the multilayer structure of the circuit element layer BPL at the non-transmission area.

On the other hand, the transmission area may mean an area in which areas where the circuit elements and the signal lines are not positioned overlap with each other in each layer configuring the multilayer structure, and thus light passes through the multilayer structure at the transmission area.

For example, the non-transmission area and the transmission area, or portions thereof, may be included in each of the plurality of pixel areas PXA. That is, the circuit element layer BPL may be included in each of the plurality of pixel areas PXA.

In some embodiments, the circuit element layer BPL may include at least one insulating layer for electrically insulating the circuit elements and the signal lines In some embodiments, the circuit element layer BPL may include a line portion located in the non-display area NA of the substrate SUB, and may supply the power and signals corresponding to lines connected to the pixels PXL.

The light emitting element layer LDL may be located on one surface of the circuit element layer BPL. The light emitting element layer LDL may include a plurality of light emitting elements LD connected to the circuit elements and/or the lines of the circuit element layer BPL through a contact hole or the like. The light emitting elements LD may be organic light emitting diodes, or ultra-small light emitting elements using a structure in which an inorganic crystal structure is grown. In one or more embodiments, at least one of the plurality of light emitting elements LD may be located in each pixel area PXA.

Each of the pixels PXL may include the circuit elements located on the circuit element layer BPL, and at least one light emitting element LD located on the light emitting element layer LDL above the circuit element layer BPL. A detailed description of a structure of the pixel PXL will be described later.

The protective layer PTL may be located above the light emitting element layer LDL so as to cover the display area AA. The protective layer PTL may include a sealing member, such as a thin film encapsulation (TFE) or a sealing substrate, and may further include a protective film or the like in addition to the sealing member.

The adhesive layer ADL is located between the protective layer PTL and the window WIN to couple the protective layer PTL and the window WIN. The adhesive layer ADL may include a transparent adhesive such as an optical clear adhesive (OCA), and may include various adhesive materials in addition to the OCA.

The window WIN is a protective member located at the uppermost end of a module of the display device 10 including the display panel 110, and may be a substantially transparent transmission substrate. The window WIN may have a multilayer structure selected from a glass substrate, a plastic film, and a plastic substrate. The window WIN may include a rigid or flexible substrate, and a material of the window WIN is not for example limited.

In various embodiments of the present disclosure, the display device 10 may further include a polarization plate, a touch panel (touch electrode layer), and/or the like. For example, the display device 10 may further include a polarization plate and/or a touch panel located between the protective layer PTL and the window WIN.

The second protective layer may be located on the other surface of the substrate SUB. The second protective layer may be coupled to the substrate SUB by the second adhesive layer.

The second adhesive layer may firmly bond (or attach) the substrate SUB and the second protective layer. The second adhesive layer may include a transparent adhesive such as an OCA. The second adhesive layer may include a pressure sensitive adhesive (PSA) in which an adhesive material acts or activates when a pressure for adhering to an adhesive surface is applied. When the second adhesive layer includes a PSA, the second adhesive layer may be adhered to the adhesive surface at room temperature only by pressure without an additional heat process or UV process.

The second protective layer may reduce or block inflow of oxygen, moisture, and the like from the outside, and may be provided in a form of a single layer or a multilayer. The second protective layer may be configured in a film form to further secure flexibility of the display panel 110. in some embodiments, the second protective layer may be coupled to the sensor layer PSL through another adhesive layer including a transparent adhesive, such as an OCA.

The light blocking layer PHL may be located between the light emitting element layer LDL and the sensor layer PSL. For example, the light blocking layer PHL may be located between the substrate SUB and the circuit element layer BPL, as shown in FIG. 4. The light blocking layer PHL may include the plurality of opening portions PIH1 and PIH2 as described with reference to FIG. 2.

The plurality of first opening portions PIH1 may be provided to overlap the non-transmission area of the circuit element layer BPL. That is, when the substrate SUB, the light blocking layer PHL, and the circuit element layer BPL are sequentially stacked, the first light L1 incident from the substrate SUB to the circuit element layer BPL may be transferred to the circuit element layer BPL through the first opening portion PIH1. On the other hand, the second light L2 incident from the circuit element layer BPL to the substrate SUB may not pass through the first opening portion PIH1 due to the non-transmission area overlapping the first opening portion PIH1.

The first light L1 is laser light that is emitted to repair the pixel area PXA. The first light L1 may pass through the first opening portion PIH1 along a direction from the substrate SUB to the circuit element layer BPL, and may disconnect the lines included in the pixel area PXA to darken the pixel area PXA.

Because the second light L2 is the above-described reflected light, and the non-transmission area is located above the first opening portion PIH1, the second light L2 does not pass through the first opening portion PIH1, and thus the second light L2 is not transferred to the sensor layer PSL. That is, the reflected light L2 is blocked from flowing into the sensor layer PSL through the first opening portion PIH1, and thus a light sensing characteristic of the sensor layer PSL may be prevented from deteriorating.

Meanwhile, the sensor layer PSL may be provided to the display device 10 after the repair of the display panel 110 is completed.

The plurality of second opening portions PIH2 may be provided to overlap the transmission area of the circuit element layer BPL. That is, the light L2 emitted from the light source and reflected from the finger of the user may flow into the sensor layer PSL through the second opening portion PIH2.

For example, the display panel 110 may transparently form the transmission area overlapping the second opening portion PIH2 so that the reflected light L2 reflected by the fingerprint of the finger may pass through the second opening portion PIH2. In addition, to reduce loss of the reflected light L2 suitable for fingerprint sensing, the display panel 110 may be configured so that light that satisfies a field of view (FOV, or referred to as a "viewing angle") of a predetermined angle range passes through each second opening portion PIH2.

The sensor layer PSL may be located so as to overlap the display panel 110 in at least the display area AA. A distance between the light sensors PHS included in the sensor layer PSL may be set such that the light sensors PHS are densely arranged, so that the reflected light L2 reflected from an object to be observed (for example, a specific area of the finger such as a fingerprint area) may be incident on at least two adjacent light sensors PHS.

The light sensors PHS of the sensor layer PSL may output an electrical signal corresponding to the reflected light L2 received through the second opening portions PIH2 as a sensing signal. The reflected light L2 received by each light sensor PHS may have different optical characteristics (for example, frequencies, wavelengths, sizes, and the like) according to whether the reflected light L2 is due to a valley or a ridge of the fingerprint formed on the finger of the user. Therefore, each of the light sensors PHS may output a sensing signal having different electrical characteristics corresponding to the optical characteristics of the reflected light L2. The sensing signal output by the light sensors PHS may be converted into image data, and may be used for fingerprint identification of the user.

A fingerprint sensing method of the display device 10 according to one or more embodiments will be briefly described as follows. During a fingerprint sensing period during which the light sensors PHS are activated, in a state in which the finger (for example, the fingerprint area) of the user is in contact or in close proximity to the display area AA, the pixels PXL (for example, the light emitting elements LD included in the pixels PXL) of the display area AA may be emitted. For example, during the fingerprint sensing period, all of the pixels PXL of the display area AA may substantially simultaneously or sequentially emit light. Alternatively, only some pixels PXL may emit light at respective intervals (e.g., at predetermined intervals) among the pixels PXL of the display area AA, or only some pixels PXL that emit light of a specific color (for example, light of a short wavelength such as blue light) may be selectively emitted.

Some of light emitted from the pixels PXL may be reflected by the finger of the user, and may pass through the transmission area and the second opening portion PIH2 formed in each layer of the display device 10 to be incident on the light sensors PHS. For example, a fingerprint shape (fingerprint pattern) of the user may be detected based on a light amount difference and/or a waveform of the reflected light L2 reflected from ridges and valleys of each fingerprint.

Meanwhile, although the display device 10 also uses the light emitting elements LD of the pixels PXL as a light source of the fingerprint sensor, embodiments of the present disclosure are not limited thereto. For example, the display device 10 according to other embodiments of the present disclosure may include a separate light source for fingerprint sensing.

The display device 10 according to one or more embodiments may include a driving circuit for driving the display panel 110. For example, the driving circuit may output a data signal corresponding to the image data to the display panel 110, or may output a driving signal for the light sensor PHS, and may receive a sensing signal received from the light sensor PHS. The driving circuit receiving the sensing signal may detect the fingerprint shape of the user by using the sensing signal.

In various embodiments of the present disclosure, the driving circuit may include a panel driver and a fingerprint detector. The panel driver may supply the data signal corresponding to the image data to the pixels PXL while sequentially scanning the pixels PXL of the display area AA. Then, the display panel 110 may display an image corresponding to the image data.

In one or more embodiments, the panel driver may supply a driving signal for the fingerprint sensing to the pixels PXL. Such a driving signal may be provided for the pixels PXL to emit light and operate as a light source for the light sensor PHS.

The fingerprint detector may transfer the driving signal for driving the light sensors PHS to the light sensors PHS, and may detect the user fingerprint based on the sensing signal received from the light sensors PHS.

Figure 5:
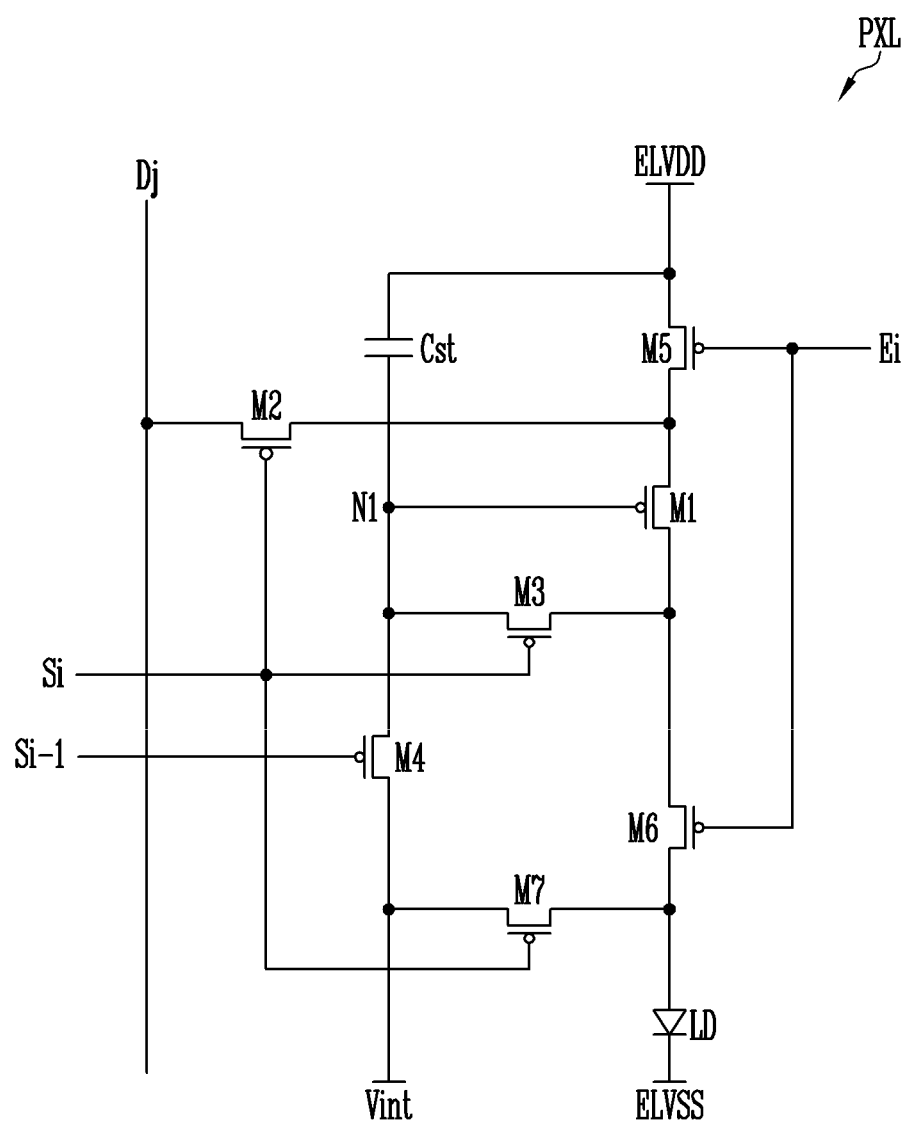
FIG. 5 is a circuit diagram illustrating a pixel according to embodiments of the present disclosure.

FIG. 5 is a circuit diagram illustrating a pixel according to embodiments of the present disclosure. In FIG. 5, for convenience of description, an active type pixel connected to an i-th (i is a natural number) scan line Si that is located in an i-th horizontal pixel column, an i-th light emitting control line Ei, and a j-th (j is a natural number) data line Dj that is located in a j-th vertical pixel column, and including seven transistors is shown. However, a structure of the pixel PXL in embodiments of the present disclosure is not limited to a structure shown in FIG. 5.

Referring to FIG. 5, the pixel PXL according to embodiments of the present disclosure may include first to seventh transistors M1 to M7, a storage capacitor Cst, and a light emitting element LD.

A first electrode of the first transistor M1 may be connected to first power ELVDD through the fifth transistor M5, and a second electrode of the first transistor M1 may be connected to an anode electrode the light emitting element LD through the sixth transistor M6. In addition, a gate electrode of the first transistor M1 may be connected to a first node N1. The first transistor M1 may control an amount of a current flowing from the first power ELVDD to second power ELVSS through the light emitting element LD in correspondence with a voltage of the first node N1.

The second transistor M2 (switching transistor) may be connected between the j-th data line Dj and the first electrode of the first transistor M1. In addition, a gate electrode of the second transistor M2 may be connected to the i-th scan line Si. The second transistor M2 may be turned on when a scan signal is supplied to the i-th scan line Si to electrically connect the j-th data line Dj and the first electrode of the first transistor M1 with each other.

The third transistor M3 may be connected between the second electrode of the first transistor M1 and the first node N1. In addition, a gate electrode of the third transistor M3 may be connected to the i-th scan line Si. The third transistor M3 may be turned on when a scan signal of a gate-on voltage is supplied to the i-th scan line Si to electrically connect the second electrode of the first transistor M1 and the first node N1 with each other. Therefore, when the third transistor M3 is turned on, the first transistor M1 may be connected in a diode form.

The fourth transistor M4 (initialization transistor) may be connected between the first node N1 and initialization power Vint. In addition, a gate electrode of the fourth transistor M4 may be connected to an (i-1)-th scan line Si-1. The fourth transistor M4 may be turned on when a scan signal is supplied to the (i-1)-th scan line Si-1 to supply a voltage of the initialization power Vint to the first node N1.

FIG. 5 illustrates the (i-1)-th scan line Si-1 being used as an initialization control line for initializing a gate node of the first transistor M1, that is, the first node N1. However, the present disclosure is not limited thereto. For example, in other embodiments of the present disclosure, another control line, such as an (i-2)-th scan line Si-2, may be used as the initialization control line for initializing the gate node of the first transistor M1.

The fifth transistor M5 may be connected between the first power ELVDD and the first transistor M1. In addition, a gate electrode of the fifth transistor M5 may be connected to the i-th light emitting control line Ei. The fifth transistor M5 may be turned off when a light emitting control signal of a gate-off voltage is supplied to the i-th light emitting control line Ei, and may be turned on in other cases.

The sixth transistor M6 may be connected between the first transistor M1 and the light emitting element LD. In addition, a gate electrode of the sixth transistor M6 may be connected to the i-th light emitting control line Ei. The sixth transistor M6 may be turned off when the light emitting control signal of the gate-off voltage is supplied to the i-th light emitting control line Ei, and may be turned on in other cases.

The seventh transistor M7 may be connected between the initialization power Vint and a first electrode of the light emitting element LD, for example, an anode electrode. In addition, a gate electrode of the seventh transistor M7 may be connected to the i-th scan line Si. The seventh transistor may be turned on when the scan signal of the gate-on voltage (for example, a low level voltage) is supplied to the i-th scan line Si to supply the voltage of the initialization power Vint to the anode electrode of the light emitting element LD. Here, the voltage of the initialization power Vint may be set to a voltage that is less than that of the data signal. That is, the voltage of the initialization power Vint may be set to be equal to or less than a lowest voltage of the data signal.

The storage capacitor Cst may be connected between the first power ELVDD and the first node N1. The storage capacitor Cst may store a voltage corresponding to the data signal and to a threshold voltage of the first transistor M1.

The anode electrode of the light emitting element LD may be connected to the first transistor M1 through the sixth transistor M6, and a cathode electrode may be connected to the second power ELVSS. The light emitting element LD generates light (e.g., light of a predetermined luminance) corresponding to the amount of the current supplied from the first transistor M1. A voltage value of the first power ELVDD may be set to be greater than a voltage value of the second power ELVSS so that the current may flow to the light emitting element LD.

Meanwhile, the structure of the pixel PXL is not limited to FIG. 5. For example, pixel circuits of various structures may be applied to the pixel PXL.

FIG. 5 illustrates a case where the transistors M1 to M7 are P-type transistors, but the present disclosure is not limited thereto, and at least one of the transistors M1 to M7 may be replaced with an N-type transistor.

Figure 6:
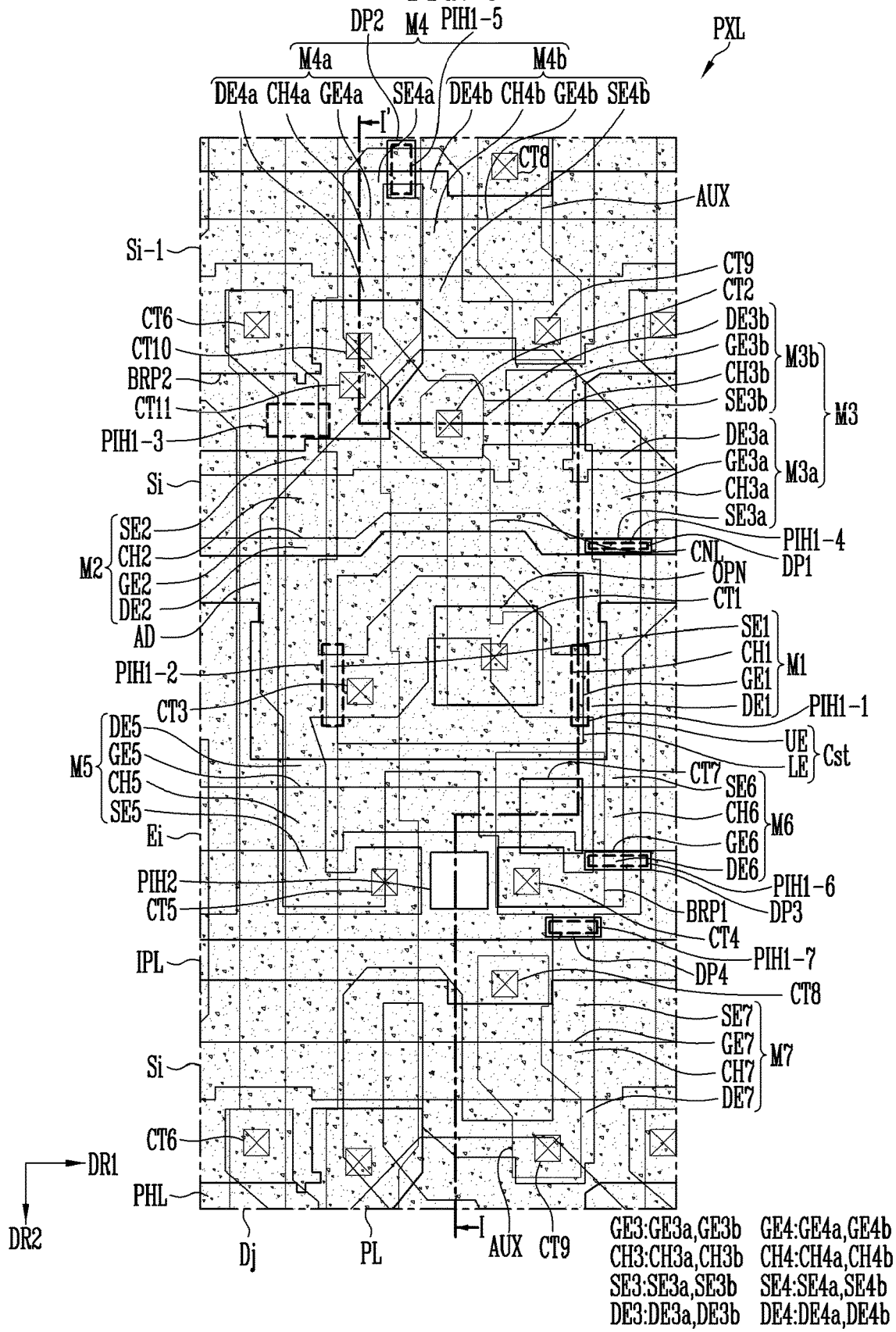
FIG. 6 is a plan view illustrating a layout including the pixel and the light blocking layer shown in FIG. 5 according to embodiments of the present disclosure.

FIG. 6 is a plan view illustrating a layout including the pixel and the light blocking layer shown in FIG. 5, and FIG. 7 is a cross-sectional view taken along the line I-I' of FIG. 6. For example, FIG. 6 shows a layout of the pixel PXL including an area overlapping the second opening portion PIH2 of the light blocking layer PHL among arbitrary pixels PXL located in the display area AA of FIG. 1.

In describing FIGS. 6 and 7, for convenience, a scan line of an (i-1)-th row is referred to as an "(i-1)-th scan line Si-1", a scan line of an i-th row is referred to as an "i-th scan line Si", a light emitting control line of the i-th row is referred to as a "light emitting control line Ei", a data line of a j-th column is referred to as a "data line Dj", and a power line of the j-th column, for example, a power line of the j-th column, to which the first power ELVDD is applied, is referred to as a "power line PL".

Referring to FIGS. 6 and 7 together with the embodiments described above, the display device 10 may include the pixels PXL located in the display area AA, and may include the signal lines for supplying the driving signals and/or power to the pixels PXL. The lines may include the scan lines Si-1 and Si, the data line Dj, the light emitting control line Ei, the power line PL, and an initialization power line IPL.

The scan lines Si-1 and Si may extend in a first direction DR1 in the display area AA. The scan lines Si-1 and Si may include the (i-1)-th scan line Si-1 and the i-th scan line Si that are sequentially arranged along a second direction DR2 intersecting the first direction DR1. The scan lines Si-1 and Si may receive scan signals. For example, the (i-1)-th scan line Si-1 may receive an (i-1)-th scan signal, and the i-th scan line Si may receive an i-th scan signal.

The light emitting control line Ei may extend in the first direction DR1 so as to be parallel to the scan lines Si-1 and Si in the display area AA. The light emitting control line Ei may receive a light emitting control signal.

The data line Dj may extend in the second direction DR2 in the display area AA. That is, the data line Dj may extend in a direction intersecting the direction of the control lines Si-1, Si, and Ei including the scan lines Si-1 and Si and the light emitting control line Ei. The data line Dj may receive a data signal.

The power line PL may extend along the second direction DR2 in the display area AA, but is not limited thereto. The power line PL may be located to be spaced apart from the data line Dj, and may receive the first power ELVDD.

The initialization power line IPL may extend along the first direction DR1 in the display area AA, but is not limited thereto. The initialization power line IPL may receive the initialization power Vint.

In embodiments of the present disclosure, the pixel PXL may include the first to seventh transistors M1 to M7, the storage capacitor Cst, and the light emitting element LD.

The first transistor M1 may include a first gate electrode GE1, a first source electrode SE1, and a first drain electrode DE1.

In one or more embodiments, the first gate electrode GE1 may be located so as to overlap a first channel CH1 of the active pattern ACT, with at least one insulating layer, for example a gate insulating layer 113, interposed therebetween. The first gate electrode GE1 may be connected to a third drain electrode DE3 (including DE3a and DE3b) of the third transistor M3, and to a fourth source electrode SE4 (including SE4a and SE4b) of the fourth transistor M4.

The first gate electrode GE1 may be connected to the third drain electrode DE3 and to the fourth source electrode SE4 by a connection line CNL. One end of the connection line CNL may be connected to the first gate electrode GE1 through a first contact hole CT1, and the other end of the connection line CNL may be connected to the third drain electrode DE3 and to the fourth source electrode SE4 through a second contact hole CT2.

In embodiments of the present disclosure, the first channel CH1, the first source electrode SE1, and the first drain electrode DE1 may be formed of a semiconductor pattern in which an impurity is either doped or not. For example, the first source electrode SE1 and the first drain electrode DE1 may be formed of a semiconductor pattern in which an impurity is doped, and the first channel CH1 may be formed of a semiconductor pattern in which an impurity is not doped.

The first channel CH1 has a shape extending in an arbitrary direction, and may have a shape that is bent several times along an extended longitudinal direction. The first channel CH1 may overlap the first gate electrode GE1 on a plan view. A channel region of the first transistor M1 may be formed to be long by forming the first channel CH1 to be long. Therefore, a driving range of a gate voltage applied to the first transistor M1 is widened. Thus, a grayscale of the light emitted from the light emitting element LD may be finely or precisely controlled.

The first source electrode SE1 may be connected to one end of the first channel CH1. The first source electrode SE1 may be connected to a second drain electrode DE2 of the second transistor M2, and to a fifth drain electrode DE5 of the fifth transistor M5. In one or more embodiments, the first drain electrode DE1 may be connected to the other end of the first channel CH1. The first drain electrode DE1 may be connected to a third source electrode SE3 of the third transistor M3 and to a sixth source electrode SE6 of the sixth transistor M6.

The second transistor M2 may include a second gate electrode GE2, a second channel CH2, a second source electrode SE2, and a second drain electrode DE2.

The second gate electrode GE2 may be located so as to overlap a second channel CH2, with at least one insulating layer, for example, the gate insulating layer 113, interposed therebetween. The second gate electrode GE2 may be connected to the i-th scan line Si.

The second channel CH2, the second source electrode SE2, and the second drain electrode DE2 may be formed of a semiconductor pattern in which an impurity is either doped or not. For example, the second source electrode SE2 and the second drain electrode DE2 may be formed of a semiconductor pattern in which an impurity is doped, and the second channel CH2 may be formed of a semiconductor pattern in which an impurity is not doped. The second channel CH2 may correspond to a portion overlapping the second gate electrode GE2.

One end of the second source electrode SE2 may be connected to the second channel CH2, and the other end of the second source electrode SE2 may be connected to the data line Dj through a sixth contact hole CT6. In one or more embodiments, one end of the second drain electrode DE2 may be connected to the second channel CH2, and the other end of the second drain electrode DE2 may be connected to the first source electrode SE1 of the first transistor M1 and to the fifth drain electrode DE5 of the fifth transistor M5.

The third transistor M3 may be provided with a double gate structure to reduce or prevent a leakage current. That is, the third transistor M3 may include 3a-th transistor M3a and a 3b-th transistor M3b. The 3a-th transistor M3a may include a 3a-th gate electrode GE3a, a 3a-th active pattern ACT3a, a 3a-th source electrode SE3a, and a 3a-th drain electrode DE3a. The 3b-th transistor M3b may include a 3b-th gate electrode GE3b, a 3b-th active pattern ACT3b, a 3b-th source electrode SE3b, and a 3b-th drain electrode DE3b. Hereinafter, the 3a-th gate electrode GE3a and the 3b-th gate electrode GE3b are referred to as a third gate electrode GE3, the 3a-th active pattern ACT3a and the 3b-th active pattern ACT3b are referred to as a third channel CH3, the 3a-th source electrode SE3a and the 3b-th source electrode SE3b are referred to as the third source electrode SE3, and the 3a-th drain electrode DE3a and the 3b-th drain electrode DE3b are referred to as the third drain electrode DE3.

The third gate electrode GE3 may be located so as to overlap the third channel CH3, with at least one insulating layer, for example, the gate insulating layer 113, interposed therebetween. The third gate electrode GE3 may be connected to the i-th scan line Si.

The third channel CH3, the third source electrode SE3, and the third drain electrode DE3 may be formed of a semiconductor pattern in which an impurity is not doped or the impurity is doped. For example, the third source electrode SE3 and the third drain electrode DE3 may be formed of a semiconductor pattern in which an impurity is doped, and the third channel CH3 may be formed of a semiconductor pattern in which an impurity is not doped. The third channel CH3 corresponds to a portion overlapping the third gate electrode GE3.

One end of the third source electrode SE3 may be connected to the third channel CH3, and the other end of the third source electrode SE3 may be connected to the first drain electrode DE1 of the first transistor M1 and to the sixth source electrode SE6 of the sixth transistor M6. In one or more embodiments, one end of the third drain electrode DE3 may be connected to the third channel CH3, and the other end of the third drain electrode DE3 may be connected to the fourth source electrode SE4 of the fourth transistor M4. In addition, the third drain electrode DE3 may be connected to the first gate electrode GE1 of the first transistor M1 through the connection line CNL, the second contact hole CT2, and the first contact hole CT1.

The fourth transistor M4 may be provided with a double gate structure to reduce or prevent a leakage current. That is, the fourth transistor M4 may include 4a-th transistor M4a and a 4b-th transistor M4b. The 4a-th transistor M4a may include a 4a-th gate electrode GE4a, a 4a-th active pattern ACT4a, a 4a-th source electrode SE4a, and a 4a-th drain electrode DE4a. The 4b-th transistor M4b may include a 4b-th gate electrode GE4b, a 4b-th active pattern ACT4b, a 4b-th source electrode SE4b, and a 4b-th drain electrode DE4b. Hereinafter, the 4a-th gate electrode GE4a and the 4b-th gate electrode GE4b are referred to as a fourth gate electrode GE4, the 4a-th active pattern ACT4a and the 4b-th active pattern ACT4b are referred to as a fourth channel CH4, the 4a-th source electrode SE4a and the 4b-th source electrode SE4b are referred to as the fourth source electrode SE4, and the 4a-th drain electrode DE4a and the 4b-th drain electrode DE4b are referred to as a fourth drain electrode DE4.

The fourth gate electrode GE4 may be located so as to overlap the fourth channel CH4, with at least one insulating layer, for example, the gate insulating layer 113, interposed therebetween. The fourth gate electrode GE4 may be connected to the (i-1)-th scan line Si-1.

The fourth channel CH4, the fourth source electrode SE4, and the fourth drain electrode DE4 may be formed of a semiconductor pattern in which an impurity is either doped or not. For example, the fourth source electrode SE4 and the fourth drain electrode DE4 may be formed of a semiconductor pattern in which an impurity is doped, and the fourth channel CH4 may be formed of a semiconductor pattern in which an impurity is not doped. The fourth channel CH4 corresponds to a portion overlapping the fourth gate electrode GE4.

One end of the fourth source electrode SE4 may be connected to the fourth channel CH4, and the other end of the fourth source electrode SE4 may be connected to the third drain electrode DE3 of the third transistor M3. In addition, the fourth source electrode SE4 may be connected to the first gate electrode GE1 of the first transistor M1 through the connection line CNL, the second contact hole CT2, and the first contact hole CT1. One end of the fourth drain electrode DE4 may be connected to the fourth channel CH4, and the other end of the fourth drain electrode DE4 may be connected to a seventh drain electrode DE7 of the seventh transistor M7 of the pixel PXL of the (i-1)-th row. The fourth drain electrode DE4 may be connected to the initialization power line IPL through an auxiliary connection line AUX, a ninth contact hole CT9, and an eighth contact hole CTB.

The fifth transistor M5 may include a fifth gate electrode GE5, a fifth channel CH5, a fifth source electrode SE5, and a fifth drain electrode DE5.

The fifth gate electrode GE5 may be located so as to overlap the fifth channel CH5, with at least one insulating layer, for example, the gate insulating layer 113, interposed therebetween. The fifth gate electrode GE5 may be connected to the light emitting control line Ei.

The fifth channel CH5, the fifth source electrode SE5, and the fifth drain electrode DE5 may be formed of a semiconductor pattern in which an impurity is either doped or not. For example, the fifth source electrode SE5 and the fifth drain electrode DE5 may be formed of a semiconductor pattern in which an impurity is doped, and the fifth channel CH5 may be formed of a semiconductor pattern in which an impurity is not doped. The fifth channel CH5 corresponds to a portion overlapping the fifth gate electrode GE5.

One end of the fifth source electrode SE5 may be connected to the fifth channel CH5, and the other end of the fifth source electrode SE5 may be connected to the power line PL through a fifth contact hole CT5. In one or more embodiments, one end of the fifth drain electrode DE5 may be connected to the fifth channel CH5, and the other end of the fifth drain electrode DE5 may be connected to the first source electrode SE1 of the first transistor M1 and to the second drain electrode DE2 of the second transistor M2.

The sixth transistor M6 may include a sixth gate electrode GE6, a sixth channel CH6, the sixth source electrode SE6, and a sixth drain electrode DE6.

The sixth gate electrode GE6 may be located so as to overlap the sixth channel CH6, with at least one insulating layer, for example, the gate insulating layer 113, interposed therebetween. The sixth gate electrode GE6 may be connected to the light emitting control line Ei.

The sixth channel CH6, the sixth source electrode SE6, and the sixth drain electrode DE6 are formed of a semiconductor pattern in which an impurity is either doped or not. For example, the sixth source electrode SE6 and the sixth drain electrode DE6 may be formed of a semiconductor pattern in which an impurity is doped, and the sixth channel CH6 may be formed of a semiconductor pattern in which an impurity is not doped. The sixth channel CH6 corresponds to a portion overlapping the sixth gate electrode GE6.

One end of the sixth source electrode SE6 may be connected to the sixth channel CH6, and the other end of the sixth source electrode SE6 may be connected to the first drain electrode DE1 of the first transistor M1 and the third source electrode SE3 of the third transistor M3. In one or more embodiments, one end of the sixth drain electrode DE6 may be connected to the sixth channel CH6, and the other end of the sixth drain electrode DE6 may be connected to a seventh source electrode SE7 of the seventh transistor M7.

The seventh transistor M7 may include a seventh gate electrode GE7, a seventh channel CH7, the seventh source electrode SE7, and the seventh drain electrode DE7.

The seventh gate electrode GE7 may be located so as to overlap the seventh channel CH7, with at least one insulating layer, for example, the gate insulating layer 113, interposed therebetween. The seventh gate electrode GE7 may be connected to the i-th scan line Si.

The seventh channel CH7, the seventh source electrode SE7, and the seventh drain electrode DE7 may be formed of a semiconductor pattern in which an impurity is either doped or not. For example, the seventh source electrode SE7 and the seventh drain electrode DE7 may be formed of a semiconductor pattern in which an impurity is doped, and the seventh channel CH7 may be formed of a semiconductor pattern in which an impurity is not doped. The seventh channel CH7 corresponds to a portion overlapping the seventh gate electrode GE7.

One end of the seventh source electrode SE7 may be connected to the seventh channel CH7, and the other end of the seventh source electrode SE7 may be connected to the sixth drain electrode DE6 of the sixth transistor M6. In one or more embodiments, one end of the seventh drain electrode DE7 may be connected to the seventh channel CH7, and the other end of the seventh drain electrode DE7 may be connected to the initialization power line IPL through the auxiliary connection line AUX, the ninth contact hole CT9, and the eighth contact hole CTB.

The storage capacitor Cst may include a first capacitor electrode LE and a second capacitor electrode UE. In one or more embodiments, the first capacitor electrode LE may be a lower electrode of the storage capacitor Cst, and may be formed integrally with the first gate electrode GE1 of the first transistor M1. In one or more embodiments, the second capacitor electrode UE may be an upper electrode of the storage capacitor Cst and may overlap the first gate electrode GE1. In addition, on a plan view, the second capacitor electrode UE may cover at least one area of the first capacitor electrode LE. A capacitance of the storage capacitor Cst may be increased by enlarging the overlapping area of the first capacitor electrode LE and the second capacitor electrode UE.

The second capacitor electrode UE may extend in the first direction DR1. In embodiments of the present disclosure, a voltage of the same level as that of the first power ELVDD may be applied to the second capacitor electrode UE. The second capacitor electrode UE may have an opening portion OPN in an area where the first contact hole CT1 in which the first gate electrode GE1 and the connection line CNL are in contact with each other is formed.

The light emitting element LD may include the first electrode (for example, the anode electrode) AD, the second electrode (for example, the cathode electrode) CD, and the light emitting layer EML provided between the first electrode AD and the second electrode CD. In one or more embodiments, the first electrode AD and the second electrode CD may be located to overlap with each other in a light emitting area of the light emitting element layer LDL, and the light emitting layer EML may be formed in the light emitting area. That is, the light emitting area of each pixel PXL may be an area where the first electrode AD, the light emitting layer EML, and the second electrode CD of the light emitting element LD overlap each other.

The first electrode AD may be provided in a light emitting area (e.g., a predetermined light emitting area). The first electrode AD may be connected to the seventh source electrode SE7 of the seventh transistor M7 and to the sixth drain electrode DE6 of the sixth transistor M6 through a fourth contact hole CT4 and through a seventh contact hole CT7. A first bridge pattern BRP1 may be provided between the fourth contact hole CT4 and the seventh contact hole CT7. The first bridge pattern BRP1 may connect the sixth drain electrode DE6, the seventh source electrode SE7, and the first electrode AD.

Hereinafter, a stack structure (sectional structure) of the pixel PXL and the display area AA including the pixel PXL according to embodiments of the present disclosure will be described.

First, a buffer layer 112 may be provided on a first surface of the substrate SUB. A phenomenon in which metal atoms or impurities are diffused (for example, out-gassed) from the substrate SUB may be reduced or prevented. In addition, when the surface of the substrate SUB is not uniform, the buffer layer 112 may perform a function of improving surface flatness of, or planarizing, the substrate SUB. The buffer layer 112 may include an inorganic material, such as oxide or nitride, an organic material, or an organic-inorganic composite, and may be formed of a single layer or a multilayer structure of an inorganic material and an organic material. For example, the buffer layer 112 may have a structure of at least three layers formed of silicon oxide, silicon nitride, and silicon oxide.

The active pattern ACT1 to ACT7 (hereinafter, 'ACT') may be provided on the buffer layer 112. In one or more embodiments, the active patterns ACT may include the first to seventh channels CH1 to CH7. The first to seventh channels CH1 to CH7 may be formed of a semiconductor material.

The gate insulating layer 113 may be provided on the buffer layer 112 on which the first to seventh channels CH1 to CH7 are provided. In one or more embodiments, the gate insulating layer 113 may be a gate insulating film interposed between the active patterns ACT1 to ACT7 and the gate electrodes GE1 to GE7 of the transistors M1 to M7 included in the pixels PXL.

The gate insulating layer 113 may include an inorganic film and/or an organic film of one or more layers. For example, the gate insulating layer 113 may be configured of an inorganic film including SiOx, SiNx, or the like, but is not limited thereto. For example, the gate insulating layer 113 may include an inorganic insulating material or an organic insulating material, such as SiOx, SiNx, SiON, SiOF, or AlOx, and may be a single film or multiple films including at least one of these materials.

In embodiments of the present disclosure, the gate insulating layer 113 may have a limited thickness (e.g., a thickness of a predetermined range) to drive the transistors M1 to M7. For example, the gate insulating layer 113 may have a thickness of about 1000 Å to about 1500 Å, for example, about 1200 Å, but the thickness of the gate insulating layer 113 is not limited thereto.

A first conductive layer may be located on the gate insulating layer 113. In one or more embodiments, the first conductive layer may be a first gate layer. The first conductive layer may be provided with the control lines Si-1, Si, and Ei and the gate electrodes GE1 to GE7. In addition, one electrode of the storage capacitor Cst, for example, the first capacitor electrode LE may be provided on the first conductive layer. For example, the (i-1)-th scan line Si-1, the i-th scan line Si, the light emitting control line Ei, and the first to seventh gate electrodes GE1 to GE7 may be provided in the first conductive layer on the gate insulating layer 113.

In one or more embodiments, the first gate electrode GE1 may also be the first capacitor electrode LE of the storage capacitor Cst. That is, the first gate electrode GE1 and the first capacitor electrode LE may be integrally formed.

The control lines Si-1, Si, and Ei, the gate electrodes GE1 to GE7, and/or the first capacitor electrode LE that is the lower electrode of the storage capacitor Cst located in the first conductive layer may be configured of the same material. For example, the control lines Si-1, Si, and Ei, the gate electrodes GE1 to GE7, and/or the first capacitor electrode LE of the storage capacitor Cst may be formed of a first gate material (e.g., a predetermined first gate metal).

An example of a material capable of configuring the first gate metal may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and other various metals may be used as the material capable of configuring the first gate metal. An example of an alloy capable of configuring the first gate metal may include MoTi, AlNiLa, and the like, and other various alloys may be used as the alloy capable of configuring the first gate metal. An example of multiple films capable of configuring the first gate metal may include Ti/Cu, Ti/Au, Mo/Al/Mo, ITO/Ag/ITO, TiN/Ti/Al/Ti, TiN/Ti/Cu/Ti, and the like, and other various conductive materials of a multiple film structure may be used as the multiple films capable of configuring the first gate metal.

On the other hand, the configuration material of the control lines Si-1, Si, and Ei, the gate electrodes GE1 to GE7, and/or the first capacitor electrode LE is not necessarily limited to metal. That is, a material capable of providing sufficient conductivity to smoothly drive the pixels PXL may be used as the material configuring the control lines Si-1, Si, and Ei, the gate electrodes GE1 to GE7, and/or the first capacitor electrode LE.

For example, the control lines Si-1, Si, and Ei, the gate electrodes GE1 to GE7, and/or the first capacitor electrode LE may be configured of a conductive polymer or a conductive metal oxide. An example of the conductive polymer capable of configuring the control lines Si-1, Si, and Ei, the gate electrodes GE1 to GE7, and/or the first capacitor electrode LE may include polythiophene based compound, polypyrrole based compound, polyaniline based compound, polyacetylene based compound, polyphenylene based compound, mixtures thereof, and the like, and for example, among the polythiophene based compounds, PEDOT/PSS compound may be used. An example of the conductive metal oxide capable of configuring the control lines Si-1, Si, and Ei, the gate electrodes GE1 to GE7, and/or the first capacitor electrode LE may include ITO, IZO, AZO, ITZO, ZnO, $SnO_2$, and the like.

A first interlayer insulating layer 114 may be provided on the first conductive layer. In one or more embodiments, the first interlayer insulating layer 114 may be a first interlayer insulating film interposed between the first capacitor electrode LE and the second capacitor electrode UE. In one or more embodiments, the first interlayer insulating layer 114 may have a thickness limited to a range (e.g., a predetermined range) to sufficiently secure a capacity of the storage capacitor Cst within a limited area. In one or more embodiments, the first interlayer insulating layer 114 may have a thickness similar to that of the gate insulating layer 113. For example, the first interlayer insulating layer 114 may have a thickness of about 1000 Å to about 1500 Å, for example, about 1400 Å, but the thickness of the first interlayer insulating layer 114 is not limited thereto.

The first interlayer insulating layer 114 may include an inorganic film and/or an organic film of one or more layers.

For example, the first interlayer insulating layer 114 may be configured of an inorganic film including SiOx, SiNx, or the like, but is not limited thereto. For example, the first interlayer insulating layer 114 may include an inorganic insulating material or an organic insulating material, such as SiOx, SiNx, SiON, SiOF, or AlOx, and may be a single film or multiple films including at least one of these materials.

A second conductive layer may be located on the first interlayer insulating layer 114. In one or more embodiments, the second conductive layer may be a second gate layer.

The second conductive layer may be provided with the second capacitor electrode UE, the initialization power line IPL, and a second bridge pattern BRP2.

In one or more embodiments, the second capacitor electrode UE may cover the first capacitor electrode LE. The second capacitor electrode UE may overlap the first capacitor electrode LE, with the first interlayer insulating layer 114 interposed therebetween to configure the storage capacitor Cst together with the first capacitor electrode LE.

The initialization power line IPL may extend along the first direction DR1 in the display area AA, but is not limited thereto. The initialization power line IPL may receive the initialization power Vint.

The second bridge pattern BRP2 may have a first area extending parallel to the first direction DR1 on the display area AA, and a second area extending parallel to the second direction DR2 at one end of the first area. However, a shape of the second bridge pattern BRP2 is not limited thereto. The second bridge pattern BRP2 may be a pattern provided as a medium that connects the light blocking layer PHL and the power line PL with each other. The second bridge pattern BRP2 may be connected to the power line PL through a tenth contact hole CT10 passing through a second interlayer insulating layer 115, and may be connected to the light blocking layer PHL through an eleventh contact hole CT11 passing through the buffer layer 112, the gate insulating layer 113, and the first interlayer insulating layer 114.

The second capacitor electrode UE, the initialization power line IPL, and the second bridge pattern BRP2 located in the second conductive layer may be configured of the same material. For example, the second capacitor electrode UE, the initialization power line IPL, and the second bridge pattern BRP2 may be formed of a second gate material (e.g., a predetermined second gate metal). In one or more embodiments, the second gate metal may be one of the metal materials previously presented as the example of the first gate metal, but is not limited thereto. In addition, the configuration material of the second capacitor electrode UE, the initialization power line IPL, and the second bridge pattern BRP2 located in the second conductive layer is not necessarily limited to metal. That is, a material capable of providing sufficient conductivity to smoothly drive the pixels PXL may be used as the material configuring the second capacitor electrode UE, the initialization power line IPL, and the second bridge pattern BRP2. For example, the second capacitor electrode UE, the initialization power line IPL, and the second bridge pattern BRP2 located in the second conductive layer may be configured of a conductive polymer or a conductive metal oxide.

The second interlayer insulating layer 115 may be provided on the second conductive layer. In one or more embodiments, the second interlayer insulating layer 115 may be a second interlayer insulating film. The second interlayer insulating layer 115 may have a thickness that is greater than that of the gate insulating layer 113 and the first interlayer insulating layer 114. For example, the thickness of the second interlayer insulating layer 115 may be equal to or greater than a sum of the thickness of the gate insulating layer 113 and the thickness of the first interlayer insulating layer 114. For example, the second interlayer insulating layer 115 may have a thickness of about 5000 Å, but the thickness of the second interlayer insulating layer 115 is not limited thereto. As described above, when the second interlayer insulating layer 115 is formed to have a sufficient thickness that is greater than the sum of the thickness of the gate insulating layer 113 and the thickness the first interlayer insulating layer 114, electrical stability between components located below and above the second interlayer insulating layer 115 may be ensured. Therefore, short defect (e.g., electrical shorts) may be effectively prevented.

The second interlayer insulating layer 115 may include an inorganic film and/or an organic film of one or more layers. For example, the second interlayer insulating layer 115 may be configured of an inorganic film including SiOx, SiNx, or the like, but is not limited thereto. For example, the second interlayer insulating layer 115 may include an inorganic insulating material or an organic insulating material such as SiOx, SiNx, SiON, SiOF, or AlOx, and may be a single film or multiple films including at least one of these materials.

A third conductive layer may be located on the second interlayer insulating layer 115. In one or more embodiments, the third conductive layer may be a source-drain layer.

The third conductive layer may be provided with the data line Dj, the power line PL, the connection line CNL, the first bridge pattern BRP1, and the auxiliary connection line AUX.

The data line Dj may be electrically connected to the second source electrode SE2 through the sixth contact hole CT6 passing through the gate insulating layer 113, the first interlayer insulating layer 114, and the second interlayer insulating layer 115.

The power line PL may be connected to the second capacitor electrode UE that is the upper electrode of the storage capacitor Cst through a third contact hole CT3 passing through the second interlayer insulating layer 115. In addition, the power line PL may be connected to the fifth source electrode SE5 through the fifth contact hole CT5 passing through the gate insulating layer 113, the first interlayer insulating layer 114, and the second interlayer insulating layer 115.

The power line PL may be further connected to the second bridge pattern BRP2 through the tenth contact hole CT10 passing through the second interlayer insulating layer 115. Because the second bridge pattern BRP2 is connected to the light blocking layer PHL through the eleventh contact hole CT11, the power line PL may be finally connected to the light blocking layer PHL.

The connection line CNL may be connected to the first gate electrode GE1 through the first contact hole CT1 passing through the first interlayer insulating layer 114 and the second interlayer insulating layer 115. In addition, the connection line CNL may be electrically connected to the third drain electrode DE3 and the fourth source electrode SE4 through the second contact hole CT2 passing through the gate insulating layer 113, the first interlayer insulating layer 114, and the second interlayer insulating layer 115.

The first bridge pattern BRP1 may be a pattern provided as a medium for connecting the sixth drain electrode DE6 and the first electrode AD, and located between the sixth drain electrode DE6 and the first electrode AD. The first bridge pattern BRP1 may be electrically connected to the sixth drain electrode DE6 and the seventh source electrode SE7 through the fourth contact hole CT4 passing through the gate insulating layer 113, the first interlayer insulating layer 114, and the second interlayer insulating layer 115.

The auxiliary connection line AUX may be connected to the initialization power line IPL through the eighth contact hole CT8 passing through the second interlayer insulating layer 115. In addition, the auxiliary connection line AUX may be connected to the seventh drain electrode DE7 through the ninth contact hole CT9 passing through the gate insulating layer 113, the first interlayer insulating layer 114, and the second interlayer insulating layer 115.

The data line Dj, the power line PL, the connection line CNL, the first bridge pattern BRP1 and/or the auxiliary connection line AUX located in the third conductive layer may be configured of the same material. For example, the data line Dj, the power line PL, the connection line CNL, the first bridge pattern BRP1 and/or the auxiliary connection line AUX may be formed of a predetermined source drain metal.

The source drain metal may be one of the metal materials previously presented as the example of the first and/or second gate metal, but is not limited thereto. In addition, the configuration material of the data line Dj, the power line PL, the connection line CNL, the first bridge pattern BRP1 and/or the auxiliary connection line AUX, which are located in the third conductive layer, is not necessarily limited to metal. That is, a material capable of providing sufficient conductivity to smoothly drive the pixels PXL may be used as the material configuring the data line Dj, the power line PL, the connection line CNL, the first bridge pattern BRP1 and/or the auxiliary connection line AUX. For example, the data line Dj, the power line PL, the connection line CNL, the first bridge pattern BRP1, and/or the auxiliary connection line AUX may be configured of a conductive polymer or a conductive metal oxide.

At least two of the first gate metal, the second gate metal, and the source drain metal may be formed of the same material. For example, the first gate metal and the second gate metal may be formed of the same material even though the first gate metal and the second gate metal are located on different layers. However, embodiments of the present disclosure are not limited thereto. For example, in another embodiment, all of the first gate metal, the second gate metal, and the source drain metal may be formed of different materials.

A protective layer 116 may be provided on the third conductive layer. In one or more embodiments, the protective layer 116 may include a passivation film and/or a planarization film. The protective layer 116 may include a seventh contact hole CT7 exposing a portion of the bridge pattern BRP.

The light emitting element LD may be provided on the protective layer 116. The light emitting element LD may include the first electrode AD, the second electrode CD, and the light emitting layer EML provided between the first and second electrodes AD and CD.

In embodiments of the present disclosure, the protective layer 116 may have a thickness of about 1500 Å to about 1800 Å, for example about 1600 Å, but the thickness of the protective layer 116 is not limited thereto.

At least one of the first electrode AD and the second electrode CD may be a transmission electrode. For example, when the light emitting element LD is a back surface light emitting type organic light emitting display element, the first electrode AD may be a transmission electrode, and the second electrode CD may be a reflective electrode. On the other hand, when the light emitting element LD is a front surface light emitting type organic light emitting display element, the first electrode may be a reflective electrode and the second electrode may be a transmission electrode. In addition, when the light emitting element LD is a dual surface light emitting type organic light emitting display element, both of the first electrode AD and the second electrode CD may be transmission electrodes. Hereinafter, a case where the light emitting element LD is a front surface light emitting type organic light emitting display element, and where the first electrode AD is an anode electrode, will be described as an example. In addition, in some embodiments, the light emitting element LD is used as a light source, but the present disclosure is not limited thereto. For example, the light emitting element LD may be replaced with another type of light emitting element.

The first electrode AD may be provided on the protective layer 116. The first electrode AD may be connected to the first bridge pattern BRP1 through the seventh contact hole CT7 passing through the protective layer 116. Because the first bridge pattern BRP1 is connected to the sixth drain electrode DE6 and to the seventh source electrode SE7 through the fourth contact hole CT4, the first electrode AD may be finally connected to the sixth drain electrode DE6 and the seventh source electrode SE7 through the first bridge pattern BRP1.

The first electrode AD may include a reflective film capable of reflecting light, and a transparent conductive film located above or under the reflective film. At least one of the transparent conductive film and the reflective film may be connected to the sixth drain electrode DE6 and the seventh source electrode SE7.

The reflective film may include a material capable of reflecting light. For example, the reflective film may include at least one of aluminum (Al), silver (Ag), chromium (Cr), molybdenum (Mo), platinum (Pt), nickel (Ni), and an alloy thereof.

The transparent conductive film may include a transparent conductive oxide. For example, the transparent conductive film may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The light emitting layer EML may be located on an exposed surface of the first electrode AD. The light emitting layer EML may have a multilayer thin film structure including a light generation layer (LGL). For example, the light emitting layer EML may include a hole injection layer (HIL) for injecting holes, a hole transport layer (HTL) for increasing hole recombination potential by suppressing movement of electrons that are excellent in transportability of holes and are not combined in the light generation layer, wherein the light generation layer is for emitting light by recombination of the injected electrons and holes. The light emitting layer EML may also include a hole blocking layer (HBL) for suppressing the movement of the holes that are not combined in the light generation layer, an electron transport layer (ETL) for smoothly transporting the electrons to the light generation layer, and/or an electron injection layer (EIL) for injecting the electrons.

A color of the light generated in the light generation layer may be one of red, green, blue, and white, but the present disclosure is not limited thereto. For example, the color of the light generated in the light generation layer of the light emitting layer EML may be one of magenta, cyan, and yellow.

The hole injection layer, the hole transport layer, the hole blocking layer, the electron transport layer, and the electron injection layer may be a common film connected with each other in adjacent light emitting areas.

The second electrode CD may be a transflective film. For example, the second electrode CD may be a thin film metal layer having a thickness sufficiently thin to transmit the light emitted from the light emitting layer EML. For example, the second electrode CD may transmit some of the light emitted from the light emitting layer EML, and may reflect a remaining portion of the light emitted from the light emitting layer EML.

In one or more embodiments, the second electrode CD may include a material having a workfunction that is less than that of the transparent conductive film. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof.

Some of the light emitted from the light emitting layer EML may not transmit through the second electrode CD, and the light reflected from the second electrode CD may be reflected again from the reflective film. That is, the light emitted from the light emitting layer EML may resonate between the reflective film and the second electrode CD. A light extraction efficiency of the organic light emitting elements LD may be improved by the resonance of the light.

A pixel definition film (or bank layer) 117 for partitioning the light emitting area of each pixel PXL may be provided on the substrate SUB on which the first electrode AD and the like are located. The pixel definition film 117 may expose an upper surface of the first electrode AD, and may be protruded from the substrate SUB along a circumference of each light emitting area.

The light emitting layer EML may be provided in the light emitting area of each pixel PXL surrounded by the pixel definition film 117 and the second electrode CD may be provided on the light emitting layer EML. One of the first electrode AD and the second electrode CD may be an anode electrode, and the other may be a cathode electrode. For example, the first electrode AD may be an anode electrode, and the second electrode CD may be a cathode electrode.

The pixel definition film 117 may include an organic insulating material. For example, the pixel definition film 117 may include at least one of polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

The protective layer PTL covering the second electrode CD may be provided on the second electrode CD. The protective layer PTL may be configured of a thin film encapsulation layer. In one or more embodiments, the thin film encapsulation layer may be replaced with another type of encapsulation film, encapsulation substrate, protective film of at least one layer, or the like.

The thin film encapsulation layer may prevent oxygen and moisture from penetrating into the light emitting element LD. To this end, the thin film encapsulation layer may include an inorganic film. The inorganic film may include at least one of silicon oxide, silicon nitride, silicon oxynitride, aluminum oxide, titanium oxide, zirconium oxide, and tin oxide.

Each of the circuit elements and the lines located on the first surface of the substrate SUB from the buffer layer 112 to the protective layer 116 may configure the circuit element layer BPL of the display device 10 and/or the fingerprint sensor. In addition, the light emitting elements LD located in each pixel PXL, from the first electrode AD to the second electrode CD and the thin film encapsulation layer located between the light emitting elements LD, may configure the light emitting element layer LDL of the display device 10 and/or the fingerprint sensor.

Figure 8:
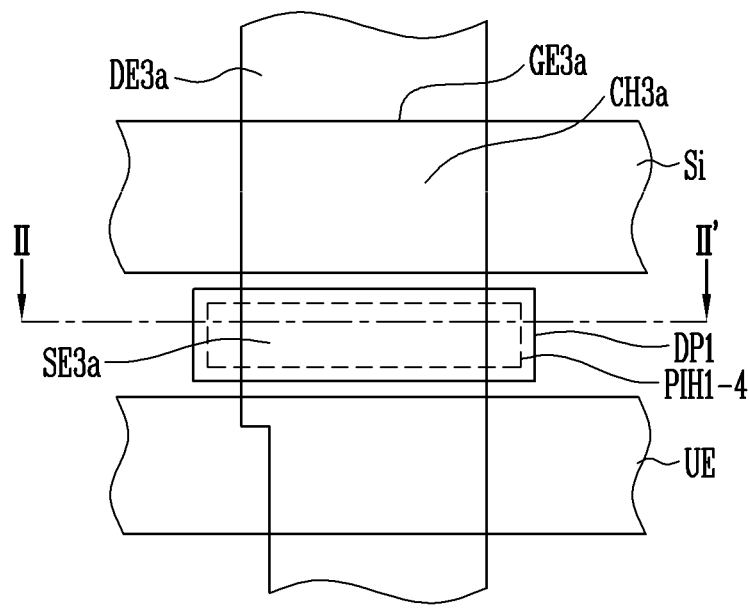
FIG. 8 is an enlarged plan view of an area in which a (1-4)-th opening portion of FIG. 6 is provided.
Figure 9A:
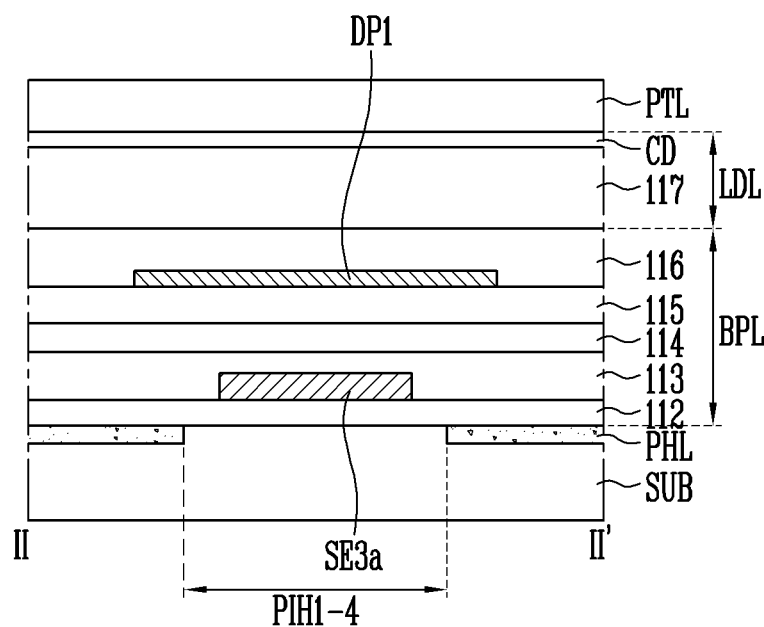
FIGS. 9A to 9C are cross-sectional views taken along the line II-II' of FIG. 8.
Figure 9B:
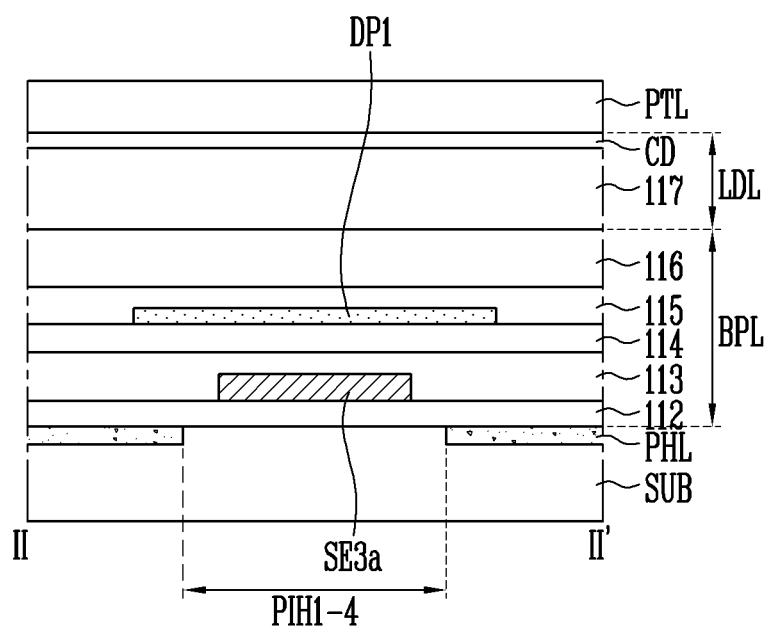
Figure 9C:
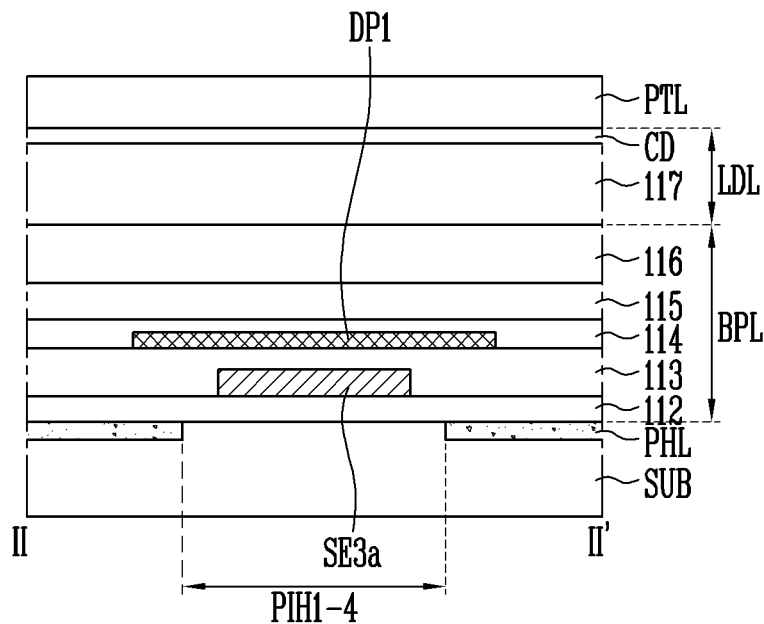

FIG. 8 is an enlarged plan view of an area in which a (1-4)-th opening portion PIH1-4 of FIG. 6 is provided, and FIGS. 9A to 9C are cross-sectional views taken along the line II-II' of FIG. 8.

Hereinafter, the first opening portion PIH1 and the second opening portion PIH2 according to embodiments of the present disclosure will be described with reference to FIGS. 6 to 9C.

Referring to FIGS. 6 and 7, the second opening portion PIH2 may overlap the transmission area of the circuit element layer BPL. For example, the second opening portion PIH2 may overlap all of the transmission area between the active patterns ACT on a plan view of the buffer layer 112, the transmission area between the plurality of circuit elements and signal lines of the first conductive layer, the transmission area between the plurality of circuit elements and signal lines of the second conductive layer on a plan view, and the transmission area between the plurality of circuit elements and signal lines of the third conductive layer on a plan view. Therefore, the reflected light may pass through the second opening portion PIH2 and may be transferred to the sensor layer PSL provided under the display panel 110.

Each of the plurality of first opening portions PIH1 may be provided to overlap the non-transmission area in which the signal lines electrically connected to the plurality of transistors included in the pixel area PXA are positioned. For example, the first opening portion PIH1 may overlap the non-transmission area in which the signal lines connected to each circuit element of the transistor for driving the pixel PXL are positioned. More specifically, the circuit element may be an active pattern of a transistor.

Referring to FIG. 6, a (1-1)-th opening portion PIH1-1 and a (1-2)-th opening portion PIH1-2 may be provided in an area overlapping the signal lines of the first transistor M1, a (1-3)-th opening portion PIH1-3 may be provided in an area overlapping the signal lines of the second transistor M2, a (1-4)-th opening portion PIH1-4 may be provided in an area overlapping the signal lines of the third transistor M3, a (1-5)-th opening portion PIH1-5 may be provided in an area overlapping the signal lines of the fourth transistor M4, a (1-6)-th opening portion PIH1-6 may be provided in an area overlapping the signal lines of the sixth transistor M6, and a (1-7)-th opening portion PIH1-7 may be provided in an area overlapping the signal lines of the seventh transistor M7. However, the position of the transistor in which the first opening portions PIH1 are provided is not limited as described above.

In various embodiments of the present disclosure, at least one of the plurality of first opening portions PIH1 may overlap the non-transmission area in which the signal line electrically connected to the driving transistor M1 of the pixel area PXA is positioned.

Referring to FIGS. 6 and 7, the (1-1)-th opening portion PIH1-1 may overlap the signal lines connected to the circuit element of the driving transistor (the first transistor M1). For example, the (1-1)-th opening portion PIH1-1 may overlap the signal line of the active pattern of the first transistor M1.

For example, the laser light L1 may be emitted to the signal line of the active pattern through the (1-1)-th opening portion PIH1-1 to disconnect the signal line. Therefore, the repair for darkening the pixel PXL may be performed by cutting off the current transferred from the first power ELVDD to the light emitting element LD through the first transistor M1.

In various embodiments of the present disclosure, the circuit element layer BPL may include a plurality of conductive layers including the non-transmission areas in which the signal lines are positioned, and may include a second non-transmission area among the non-transmission areas of the conductive layers that overlaps a first non-transmission area, and in which the signal lines electrically connected to the transistor may be provided on the first opening portion PIH1.

That is, the first non-transmission area (in which the signal lines electrically connected to the transistor are positioned) is positioned on the first opening portion PIH1, and the second non-transmission area may be provided on the first non-transmission area. For example, a plurality of second non-transmission areas may be provided on the first opening portion PIH1. As the second non-transmission area is provided on the first non-transmission area, the reflected light L2 may be reduced or prevented from passing through the first opening portion PIH1.

In various embodiments of the present disclosure, the second non-transmission area may overlap at least one of the signal lines and the circuit elements for driving the pixel PXL.

Referring to FIG. 7, the (1-1)-th opening portion PIH1-1 may overlap the first gate electrode GE1 of the first conductive layer and the second capacitor electrode UE of the second conductive layer. That is, the first non-transmission area may be an area in which the signal lines electrically connected to the driving transistor M1 are positioned, and the second non-transmission area may be an area in which the first gate electrode GE1 and the second capacitor electrode UE overlap with each other.

The (1-1)-th opening portion PIH1-1 overlaps the first gate electrode GE1 and the second capacitor electrode UE, thereby preventing the reflected light L2 from passing through the (1-1)-th opening portion PIH1-1. Meanwhile, although FIG. 7 illustrates that the (1-1)-th opening portion PIH1-1 overlaps the first gate electrode GE1 and the second capacitor electrode UE, embodiments of the present disclosure are not limited thereto. The (1-1)-th opening portion PIH1-1 may overlap at least one of various circuit elements and signal lines of the first conductive layer, the second conductive layer, and the third conductive layer.

Furthermore, the (1-2)-th opening portion PIH1-2 to the (1-7)-th opening portion PIH1-7 also may overlap the various circuit elements and/or signal lines of the first conductive layer, the second conductive layer, and the third conductive layer in a manner similar to the (1-1)-th opening portion PIH1-1, thereby preventing the reflected light L2 from passing through the (1-2)-th opening portion PIH1-2 to the (1-7)-th opening portion PIH1-7.

For example, the (1-2)-th opening portion PIH1-2 may overlap the second capacitor electrode UE of the second conductive layer, and the (1-3)-th opening portion PIH1-3 may overlap the second bridge pattern BRP2 of the second conductive layer.

In various embodiments of the present disclosure, the second non-transmission area may include a dummy pattern provided on the first non-transmission area that does not overlap the signal lines and the circuit elements for driving the pixel PXL.

Referring to FIG. 6, the (1-1)-th opening portion PIH1-1, (1-2)-th opening portion PIH1-2, and the (1-3)-th opening portion PIH1-3 may be a circuit overlap portion overlapping the various circuit elements and/or signal lines of the first to third conductive layers.

On the other hand, the (1-4)-th to (1-7)-th opening portions PIH1-4, PIH1-5, PIH1-6, and PIH1-7 may be a circuit non-overlapping portion that does not overlap the various circuit elements and/or signal lines of the first to third conductive layers.

For example, the dummy pattern DP may be provided in the second non-transmission area of the circuit non-overlapping portion. The dummy pattern DP is provided in a second non-transmission area in which the signal lines and the circuit elements are not positioned, thereby preventing the reflected light L2 from passing through the (1-4)-th to (1-7)-th opening portions PIH1-4, PIH1-5, PIH1-6, and PIH1-7 of the circuit non-overlapping portion.

Referring to FIGS. 8 to 9A, the (1-4)-th opening portion PIH1-4 may overlap a first dummy pattern DP1 provided to the third conductive layer. For example, the first dummy pattern may be provided as an island pattern independent of the various circuit elements and signal lines of the third conductive layer, or may be provided as a connection pattern connected to the circuit elements and signal lines.

In addition, referring to FIG. 9B, the (1-4)-th opening portion PIH1-4 may overlap the first dummy pattern DP1 provided in the second conductive layer. Referring to FIG. 9C, the (1-4)-th opening portion PIH1-4 may overlap the first dummy pattern DP1 provided in the first conductive layer.

Meanwhile, the (1-5)-th to (1-7)-th opening portions PIH1-5, PIH1-6, and PIH1-7 may also overlap the dummy pattern DP provided in the conductive layer, as shown in FIGS. 9A to 9B.

Referring to FIG. 6, the (1-5)-th opening portion PIH1-5 may overlap the second dummy pattern DP2, the (1-6)-th opening portion PIH1-6 may overlap a third dummy pattern DP3, and the (1-7)-th opening portion PIH1-7 may overlap a fourth dummy pattern DP4.

In various embodiments of the present disclosure, the circuit element layer BPL may further include a dummy pattern layer in which the dummy patterns DP are separately provided. For example, the dummy pattern layer including only the dummy patterns DP without the circuit elements and signal lines for driving the pixel PXL may be provided in the circuit element layer BPL.

In various embodiments of the present disclosure, a size of the second non-transmission area may be greater than a size of the first opening portion PIH1. By increasing the size of the second non-transmission area provided on the first opening portion PIH1, the reflected light L2 may be reduced or prevented from flowing into the first opening portion PIH1.

For example, a size of the (1-1)-th to (1-3)-th opening portions PIH1-1, PIH1-2, and PIH1-3 corresponding to the circuit overlapping portion may be less than a size of the various circuit elements and/or signal lines of the first to third conductive layers overlapping the (1-1)-th to (1-3)-th opening portions PIH1-1, PIH1-2, and PIH1-3. In addition, a size of the (1-4)-th to (1-7)-th opening portions PIH1-4, PIH1-5, PIH1-6, and PIH1-7 corresponding to the circuit non-overlapping portion may be less than a size of the dummy patterns DP1, DP2, DP3, and DP4 overlapping the (1-4)-th to (1-7)-th opening portions PIH1-4, PIH1-5, PIH1-6, and PIH1-7.

For convenience of description, in FIGS. 6 and 7, a width of the (1-1)-th opening portion PIH1-1 is greater than a width of the first active pattern, however, the width of the (1-1)-th opening portion PIH1-1 may be less than the width of the first active pattern. Meanwhile, the width of the (1-1)-th opening portion PIH1-1 may be less than a width of the circuit element and/or the signal line of the first conductive layer, the second conductive layer, and the third conductive layer overlapping the (1-1)-th opening portion PIH1-1.

In various embodiments of the present disclosure, at least one of the plurality of first opening portions PIH1 may overlap the non-transmission area in which the signal line electrically connected to the switching transistor M2 of the pixel area PXA is positioned.

Referring to FIGS. 6 and 7, the (1-3)-th opening portion PIH1-3 may overlap the signal line connected to the circuit element of the switching transistor (the second transistor M2). For example, the (1-3)-th opening portion PIH1-3 may overlap the signal line of the active pattern of the second transistor M2.

In this case, the laser light L1 may be emitted to the signal line of the active pattern through the (1-3)-th opening portion PIH1-3 to disconnect the signal line. Therefore, even when the scan signal is supplied to the i-th scan line Si, the second transistor M2 is not turned on, and thus the j-th data line Dj and the first electrode of the first transistor M1 are prevented from being electrically connected with each other, thereby darkening the pixel PXL.

In various embodiments of the present disclosure, at least one of the plurality of first opening portions PIH1 may overlap the non-transmission area in which the signal line electrically connected to the sixth transistor M6 connected between the driving transistor M1 of the pixel area PXA and the light emitting element LD.

Referring to FIGS. 6 and 7, the (1-6)-th opening portion PIH1-6 may overlap the signal line connected to the circuit element of the sixth transistor M6. For example, the (1-6)-th opening portion PIH1-6 may overlap the signal line of the active pattern of the sixth transistor M6.

In this case, the laser light L1 may be emitted to the signal line of the active pattern through the (1-6)-th opening portion PIH1-6 to disconnect the signal line. Therefore, the pixel PXL may be darkened by cutting off the current transferred from the first power to the light emitting element LD through the sixth transistor M6.

In various embodiments of the present disclosure, the first opening portions PIH1 may overlap the electrode of the light emitting element LD, or may overlap the touch electrode of a touch panel, thereby preventing the reflected light from passing through the first opening portion PIH1.

As described above, the display device 10 according to embodiments of the present disclosure emits the light L1 to the pixel area PXA that is suitable for repair through the plurality of first opening portions PIH1 provided in the light blocking layer PHL, and thus the repair may be performed.

Figure 11:
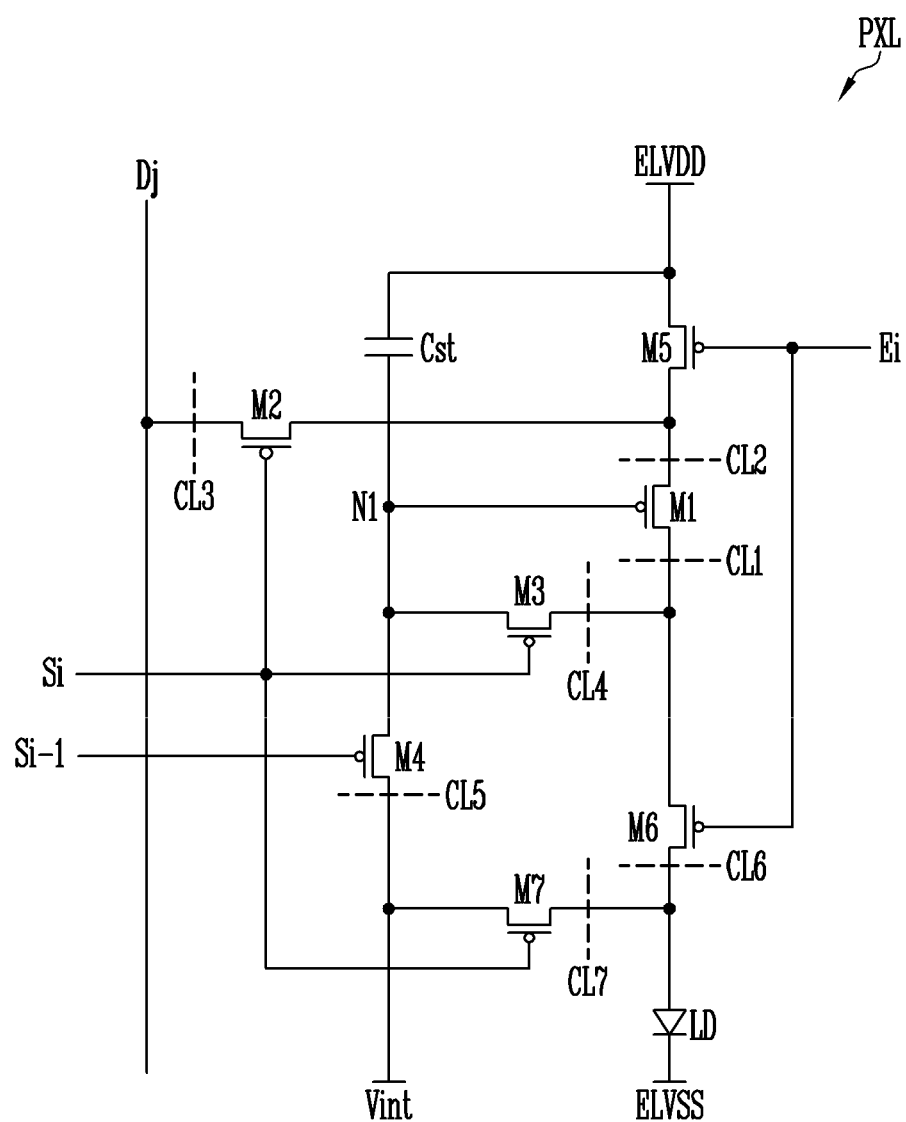
FIG. 11 illustrates a position where the repair is performed in a circuit diagram illustrating a pixel according to one or more embodiments.

FIG. 10 illustrates a repair performed in a cross-sectional view along the line I-I' of FIG. 6, and FIG. 11 illustrates a position where the repair is performed in a circuit diagram illustrating a pixel according to one or more embodiments.

Referring to FIG. 10, a method of manufacturing a display device according to embodiments of the present disclosure may include providing the substrate SUB including the display area AA and the non-display area NA, providing the light blocking layer PHL including the plurality of first opening portions PIH1 and second opening portions PIH2 on the substrate SUB, providing the circuit element layer BPL including the transmission area and the non-transmission area on the light blocking layer PHL, providing the light emitting element layer LDL on the circuit element layer BPL, and repairing the pixel area PXA benefitting from the repair. For example, the non-transmission area and the transmission area may be included in each of the plurality of pixel areas PXA.

That is, the method of manufacturing the display device according to embodiments of the present disclosure may manufacture the display device 10 including the substrate SUB, the light blocking layer PHL including the plurality of first opening portions PIH1 and the plurality of second opening portions PIH2, the circuit element layer BPL, and the light emitting element layer LDL described above.

For example, the method of manufacturing the display device may include a repair operation of emitting the light L1 to the plurality of first opening portions PIH1 overlapping the pixel area PXA to disconnect the signal line electrically connected to the transistor of the pixel area PXA. For example, the light L1 for the repair may be laser light, but a type of the light is not limited. The light used for repair of the pixel PXL may be used without limitation in the art.

The laser light L1 passes through the first opening portion PIH1 to disconnect the signal line electrically connected to the transistor of the pixel area PXA suitable for repair, thereby performing the repair for darkening the corresponding pixel PXL.

In various embodiments of the present disclosure, the repair operation may include emitting the light L1 from the substrate SUB to the circuit element layer BPL. For example, the repair may be performed by emitting the laser light L1 in an upward direction of the display panel 110 from under the substrate SUB in the display panel 110. That is, embodiments of the present disclosure may repair a lower surface of the display panel 110. Therefore, even though an upper surface repair method in which the laser light is emitted from an upper portion of the display panel 110 toward a lower direction to perform the repair is not possible, the pixel area PXA may be repaired and product yield may be improved.

In various embodiments of the present disclosure, the repair operation may include emitting the light L1 to the first opening portion PIH1 overlapping the non-transmission area in which the signal lines electrically connected to the plurality of transistors of the pixel area PXA are positioned.

Referring to FIGS. 6, 10 and 11, the laser light L1 may be emitted to the (1-1)-th opening portion PIH1-1 to disconnect CL1 the signal line connected to the first transistor M1, the laser light L1 may be emitted to the (1-2)-th opening portion PIH1-2 to disconnect CL2 the signal line connected to the first transistor M1, the laser light L1 may be emitted to the (1-3)-th opening portion PIH1-3 to disconnect CL3 the signal line connected to the second transistor M2, the laser light L1 may be emitted to the (1-4)-th opening portion PIH1-4 to disconnect CL4 the signal line connected to the third transistor M3, the laser light L1 may be emitted to the (1-5)-th opening portion PIH1-5 to disconnect CL5 the signal line connected to the fourth transistor M4, the laser light L1 may be emitted to the (1-6)-th opening portion PIH1-6 to disconnect CL6 the signal line connected to the sixth transistor M6, and the laser light L1 may be emitted to the (1-7)-th opening portion PIH1-7 to disconnect CL7 the signal line connected to the seventh transistor M7. However, the position at which the signal line of the transistor is disconnected through the first opening portions PIH1 is not limited as described above.

In various embodiments of the present disclosure, the repair operation may include emitting the later light L1 to the first opening portion PIH1 overlapping the signal line electrically connected to the driving transistor M1 of at least pixel area PXA among the plurality of first opening portions PIH1.

Referring to FIGS. 6, 10, and 11, the laser light L1 may be emitted to the (1-1)-th opening portion PIH1-1 and/or the (1-2)-th opening portion PIH1-2 to disconnect the signal line electrically connected to the driving transistor M1. Therefore, the repair for darkening the pixel PXL may be performed by cutting off the current transferred from the first power ELVDD to the light emitting element LD through the first transistor M1.

In various embodiments of the present disclosure, the repair operation may include emitting the laser light L1 to the first opening portion PIH1 overlapping the signal line electrically connected to the switching transistor M2 of at least one pixel area PXA among the plurality of first opening portions PIH1.

Referring to FIGS. 6, 10, and 11, the laser light L1 may be emitted to the (1-3)-th opening portion PIH1-3 to disconnect the signal line electrically connected to the switching transistor M2. Therefore, when the scan signal is supplied to the i-th scan line Si, the second transistor M2 is blocked from being turned on, and thus the j-th data line Dj and the first electrode of the first transistor M1 are prevented from being electrically connected with each other, thereby darkening the pixel PXL.

In various embodiments of the present disclosure, the repair operation may include emitting the laser light L1 to the first opening portion among the plurality of first opening portions that overlaps the signal line electrically connected the sixth transistor M6 connected between the driving transistor M1 of at least one pixel area PXA and the light emitting element.

Referring to FIGS. 6, 10, and 11, the laser light L1 may be emitted to the (1-6)-th opening portion PIH1-6 to disconnect the signal line electrically connected to the sixth transistor M6. Therefore, the current transferred to the light emitting element LD from the first power ELVDD through the sixth transistor M6 may be cut off, thereby darkening the pixel PXL.

In various embodiments of the present disclosure, the sensor layer PSL for sensing incident light may be provided on a surface that is opposite to the surface of the substrate SUB on which the light blocking layer PHL is provided. For example, after the repair of the circuit element layer BPL provided on one surface of the substrate SUB is completed, the sensor layer PSL may be provided on the other surface of the substrate SUB.

The foregoing detailed description illustrates and describes embodiments of the present disclosure. In addition, the foregoing description merely shows and describes preferred embodiments of the present disclosure, and as described above, embodiments of the present disclosure may be used in various other combinations, modifications, and environments, and embodiments of the present disclosure may be changed or modified within the scope of the concept of embodiments of the present disclosure disclosed in this specification, the scope equivalent to the disclosed invention, and/or the skill or knowledge in the art. Accordingly, the detailed description of embodiments of the present disclosure are not intended to limit embodiments of the present disclosure to the disclosed embodiments. Also, the appended claims should be construed as including other embodiments, including functional equivalents thereof.

What is claimed is:
1. A display device comprising:
a substrate comprising a display area comprising a plurality of pixel areas, and a non-display area adjacent the display area;
a circuit element layer on the substrate, and comprising a plurality of non-transmission areas in which a plurality of signal lines for transferring signals for driving a pixel are positioned, and a plurality of transmission areas for transmitting light and located between the signal lines in a plan view;
a light emitting element layer on the circuit element layer, and comprising light emitting elements; and
a light blocking layer between the substrate and the circuit element layer, and comprising a plurality of first opening portions overlapping the non-transmission areas, and a plurality of second opening portions overlapping the transmission areas,
wherein one of the non-transmission areas and the transmission areas are in each of the pixel areas.
2. The display device according to claim 1, wherein at least one of the first opening portions overlaps one of the non-transmission areas in which one of the signal lines, which is electrically connected to a driving transistor of one of the pixel areas, is positioned.
3. The display device according to claim 1, wherein at least one of the first opening portions overlaps one of the non-transmission areas in which one of the signal lines, which is electrically connected to a switching transistor of one of the pixel areas, is positioned.
4. The display device according to claim 1, wherein at least one of the first opening portions overlaps one of the non-transmission areas in which one of the signal lines, which is electrically connected to a transistor connected between a driving transistor of one of the pixel areas and one of the light emitting elements, is located.
5. The display device according to claim 1, wherein each of the first opening portions overlaps one of the non-transmission areas in which the signal lines, which are electrically connected to a plurality of transistors of one of the pixel areas, are positioned.
6. The display device according to claim 5, wherein the circuit element layer comprises a plurality of conductive layers comprising the non-transmission areas in which the signal lines are positioned, and
wherein a second non-transmission area overlaps a first non-transmission area of the non-transmission areas of the conductive layers in which the signal lines, which are electrically connected to the transistors, are positioned, and is on a corresponding one of the first opening portions.
7. The display device according to claim 6, wherein the second non-transmission area overlaps at least one of the signal lines and circuit elements for driving the pixel.
8. The display device according to claim 6, wherein the second non-transmission area comprises a dummy pattern on the first non-transmission area that does not overlap the signal lines and circuit elements for driving the pixel.
9. The display device according to claim 6, wherein a size of the second non-transmission area is greater than a size of the corresponding one of the first opening portions.
10. The display device according to claim 1, further comprising a sensor layer on a surface of the substrate that is opposite to another surface of the substrate on which the light blocking layer is provided, the sensor layer being configured to sense incident light.
11. The display device according to claim 10, wherein the second opening portions provide a path of light incident to the sensor layer.

12. A method of manufacturing a display device, the method comprising:
- providing a substrate comprising a display area comprising a plurality of pixel areas, and a non-display area adjacent the display area;
- providing a circuit element layer on the substrate, the circuit element layer comprising a plurality of non-transmission areas in which a plurality of signal lines for transferring signals for driving one of the pixels are positioned, and a plurality of transmission areas for transmitting light and being located between the signal lines in a plan view;
- providing a light emitting element layer comprising light emitting elements on the circuit element layer;
- providing a light blocking layer between the substrate and the circuit element layer, the light blocking layer comprising a plurality of first opening portions overlapping the non-transmission areas, and a plurality of second opening portions overlapping the transmission areas; and
- performing a repair operation by emitting light to one or more of the first opening portions overlapping one of the pixel areas, and disconnecting one or more of the signal lines electrically connected to a transistor of one of the pixel areas,
- wherein the non-transmission areas and the transmission areas are respectively located in pixel areas.

13. The method according to claim 12, wherein performing the repair operation comprises emitting light from the substrate to the circuit element layer.

14. The method according to claim 12, wherein performing the repair operation comprises emitting light to one or more of the first opening portions overlapping the signal lines that are electrically connected to a plurality of transistors of one of the pixel areas.

15. The method according to claim 12, wherein performing the repair operation comprises emitting light to one or more of the first opening portions overlapping one or more of the signal lines that are electrically connected to a driving transistor of one of the pixel areas.

16. The method according to claim 12, wherein performing the repair operation comprises emitting light to one of the first opening portions overlapping one of the signal lines electrically connected to a switching transistor of one of the pixel areas.

17. The method according to claim 12, wherein performing the repair operation comprises emitting light to one of the first opening portions overlapping one of the signal lines electrically connected to a transistor connected between a driving transistor of one of the pixel areas and the light emitting element.

18. The method according to claim 12, further comprising providing a sensor layer, which is configured to sense incident light, on a surface of the substrate that is opposite to another surface of the substrate on which the light blocking layer is provided.

* * * * *